(12) United States Patent
Kishimoto

(10) Patent No.: US 11,177,466 B2
(45) Date of Patent: Nov. 16, 2021

(54) DISPLAY APPARATUS AND METHOD FOR MANUFACTURING DISPLAY APPARATUS

(71) Applicant: Sakai Display Products Corporation, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 17/238,873

(22) Filed: Apr. 23, 2021

(65) Prior Publication Data

US 2021/0242436 A1     Aug. 5, 2021

Related U.S. Application Data

(62) Division of application No. 16/311,639, filed as application No. PCT/JP2017/040312 on Nov. 8, 2017, now Pat. No. 11,024,831.

(51) Int. Cl.
*H01L 51/56* (2006.01)
*H01L 51/52* (2006.01)

(52) U.S. Cl.
CPC .......... *H01L 51/56* (2013.01); *H01L 51/5293* (2013.01); *H01L 2227/323* (2013.01)

(58) Field of Classification Search
CPC .. H01L 51/56; H01L 51/5262; H01L 51/5237
See application file for complete search history.

(56) References Cited

U.S. PATENT DOCUMENTS

| 2005/0185116 A1 | 8/2005 | Higashi et al. |
| 2010/0247940 A1 | 9/2010 | Takahashi et al. |

(Continued)

FOREIGN PATENT DOCUMENTS

| CN | 202256945 U | 5/2012 |
| JP | S5564276 A | 5/1980 |

(Continued)

OTHER PUBLICATIONS

PCT International Search Report, International Application No. PCT/JP2017/040312, Japan Patent Office dated Feb. 6, 2018.

(Continued)

*Primary Examiner* — Douglas M Menz
(74) *Attorney, Agent, or Firm* — Snell & Wilmer LLP

(57) ABSTRACT

A display apparatus comprises: a display panel to control emission or transmission of light to display an image; a support comprising a surface on which the display panel is placed; and a holding member that is adhered onto the surface of the support and engages with an edge of the display panel to hold the display panel at a given position of the surface, wherein the display panel has an opposite surface of a display surface of the display panel, the opposite surface being directed to the support; the holding member comprises a front surface portion formed using a light-transmitting material to cover the display surface, the front surface portion being plate shaped, and a frame portion comprising a rod-shaped member provided in such a manner as to be protruded from a first surface of the front surface portion and to be along an edge of the front surface portion, the first surface being directed to the display surface; and the front surface portion comprises a first functional layer on the first surface or on a second surface opposite the first surface, the first functional layer having a given function related to propagation of light.

16 Claims, 16 Drawing Sheets

(56) References Cited

U.S. PATENT DOCUMENTS

| | | |
|---|---|---|
| 2011/0310470 A1 | 12/2011 | Horie |
| 2012/0120347 A1 | 5/2012 | Takahashi et al. |
| 2013/0300975 A1 | 11/2013 | Suzuki |
| 2014/0009914 A1 | 1/2014 | Cho et al. |
| 2014/0023799 A1 | 1/2014 | Takahashi et al. |
| 2014/0132488 A1 | 5/2014 | Kim et al. |
| 2015/0253612 A1 | 9/2015 | Hasegawa et al. |

FOREIGN PATENT DOCUMENTS

| | | | |
|---|---|---|---|
| JP | 2005208492 A | 8/2005 | |
| JP | 2009086188 A | 4/2009 | |
| JP | 2009154479 A | 7/2009 | |
| JP | 2010008476 A | 1/2010 | |
| JP | 2013235145 A | 11/2013 | |
| JP | 2014112224 A | 6/2014 | |
| JP | 2015187858 A | 10/2015 | |
| JP | 2016031929 A | 3/2016 | |
| JP | 2016097650 A | 5/2016 | |
| JP | 2016188941 A | 11/2016 | |
| JP | 2017504069 A | 2/2017 | |
| JP | 2017531204 A | 10/2017 | |
| WO | 2010109723 A1 | 9/2010 | |
| WO | 2014050138 A1 | 4/2014 | |
| WO | 2015100333 A1 | 7/2015 | |
| WO | 2015136399 A1 | 9/2015 | |
| WO | 2016012900 A1 | 1/2016 | |
| WO | 2016037967 A1 | 3/2016 | |

OTHER PUBLICATIONS

English Translation of PCT International Search Report, International Application No. PCT/JP2017/040312, Japan Patent Office dated Feb. 6, 2018.

DISPLAY APPARATUS AND METHOD FOR MANUFACTURING DISPLAY APPARATUS

CROSS-REFERENCE TO RELATED APPLICATIONS

This patent application is a divisional of U.S. patent application Ser. No. 16/311,639, having a filing/371(c) date of Jul. 22, 2019, which is a U.S. National Stage of PCT/JP2017/040312, filed Nov. 8, 2017. Priority is claimed to each patent application set forth in this Cross-Reference to Related Applications section, and the entire disclosure of each such patent application is incorporated herein.

TECHNICAL FIELD

The present invention relates to a display apparatus and a method for manufacturing a display apparatus.

BACKGROUND ART

In recent years, for flat panel display apparatuses such as organic-EL display apparatuses and liquid crystal display apparatuses, display panels formed using a resin film or a thin glass plate as a base material are being used to respond to demands for thinning down. In a large number of display apparatuses, a thin display panel in which an extremely thin material such as a resin film is used as a base material is pasted onto a surface of an arbitrary support for imparting a shape retaining property or a mechanical strength suitable for use thereof. For example, Patent Document 1 discloses a digital signage comprising an image display panel pasted to a glass plate. Patent Document 1 discloses that the image display panel is pasted to a window glass via a layer comprising a photocuring resin.

PRIOR ART DOCUMENT

Patent Document

Patent Document 1: JP 2016-97650 A

SUMMARY OF THE INVENTION

Problem to be Solved by the Invention

It is extremely difficult to remove, from a support, a display panel pasted to the support using an adhesive comprising a photocuring resin or a thermosetting resin as disclosed in Patent Document 1. Even if it can be removed from the support, remaining pieces of the adhesive and remnants of the display panel or the support remain on the pasted surface, so that reusing the display panel and the support is considered to be difficult. Moreover, with the method of pasting that is disclosed in Patent Document 1, it is difficult to accurately paste the display panel onto a given position of a glass plate. Furthermore, since the display panel is pasted using an adhesive such as a photocuring resin, it is also difficult to reposition a display panel once positioned at an inappropriate position to a normal position.

Thus, one object of the present invention is to provide a display apparatus such that, even in a case where a defect occurs in some of constituting elements of the display apparatus, other constituting elements can easily be reused in the one display apparatus or another display apparatus. Moreover, another object of the present invention is to provide a method for manufacturing a display apparatus that makes it possible to easily reuse the constituting elements as such and, moreover, to easily manufacture the display apparatus with the display panel being positioned at a proper position.

Means to Solve the Problem

A display apparatus according to one embodiment of the present invention comprises: a display panel to control emission or transmission of light to display an image; a support comprising a surface on which the display panel is placed; and a holding member that is adhered onto the surface of the support and engages with an edge of the display panel to hold the display panel at a given position of the surface, wherein the display panel has an opposite surface of a display surface of the display panel, the opposite surface being directed to the support; the holding member comprises a front surface portion formed using a light-transmitting material to cover the display surface, the front surface portion being plate shaped, and a frame portion comprising a rod-shaped member provided in such a manner as to be protruded from a first surface of the front surface portion and to be along an edge of the front surface portion, the first surface being directed to the display surface; and the front surface portion comprises a first functional layer on the first surface or on a second surface opposite the first surface, the first functional layer having a given function related to propagation of light.

A method for manufacturing a display apparatus according to another embodiment of the present invention comprises: forming a display panel by forming a plurality of display elements on a substrate; preparing a support comprising a surface on which the display panel is to be placed; preparing a holding member comprising a front surface portion, the front surface portion being plate shaped, and a frame portion comprising a rod-shaped member provided in such a manner as to be protruded from a first surface of the front surface portion and to be along an edge of the front surface portion, the first surface being a surface other than a side surface of the front surface portion; adhering the holding member onto the surface of the support while directing the first surface to the support; engaging an inner wall of the frame portion with an edge of the display panel such that a display surface of the display panel is covered by the front surface portion; and placing the display panel on the surface of the support while directing an opposite surface of the display surface to the support, wherein in preparing the holding member, the front surface portion is formed using a light-transmitting material, and a first functional layer having a given function related to propagation of light is provided on the first surface or a second surface of the front surface portion, the second surface being opposite the first surface.

Effects of the Invention

According to one embodiment of the present invention, even when a defect occurs in some of the constituting elements of one display apparatus, it is possible to easily reuse other constituting elements in the one display apparatus or another display apparatus. Moreover, according to another embodiment of the present invention, it is possible to easily manufacture a display apparatus in which reuse of constituting elements is easy and which comprises a display panel at a proper position.

EMBODIMENTS FOR CARRYING OUT THE INVENTION

Figure 1A:
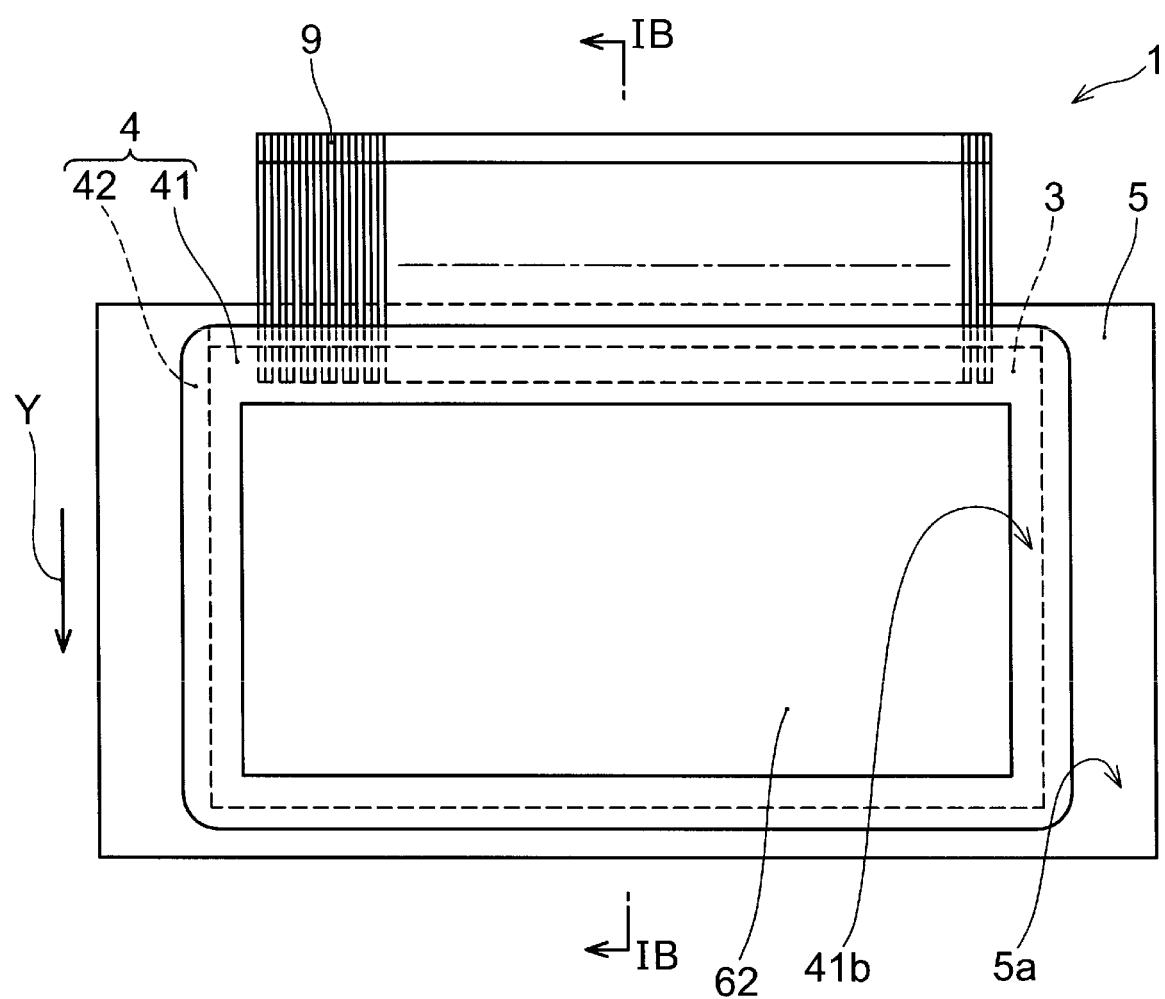
FIG. 1A shows a front view of one example of a display apparatus according to Embodiment 1 of the present invention.

The present inventor conducted inventive studies on the structure that allows reuse of a defect-free display panel or support, or other defect-free constituting elements when a defect occurs in some constituting elements of a display apparatus having the display panel fixed to a surface of the support. Then, the present inventor has found that a structure in which the display panel is fixed to the support via a member which can hold the display panel at a given position of the support can be used to appropriately fix the display panel onto the surface of the support and that the display panel can be removed easily from the support as needed. In other words, the display panel engages with a holding member formed to hold the display panel on the support, without the display panel being adhered onto the support, and the above-mentioned holding member is adhered to the support. The movement of the display panel relative to the support is restricted by the holding member, so that the display panel can be fixed onto a given position of the surface of the support. Then, when the display panel is to be removed from the support, the holding member and the display panel that are merely engaged with each other without being adhered to each other can be separated to easily remove the display panel from the support.

Moreover, the present inventor has newly found that it becomes possible to reuse a further defect-free constituting element by providing such a holding member with a portion which covers a display surface of the display panel. In other words, a polarizing plate or an antireflection layer that is provided at the display surface of the display panel to serve a specific function, in the past, was discarded with the display panel when a defect occurred in the display panel. It is considered that the polarizing plate, which has a structure far simpler than that of the display panel and deterioration of electrical characteristics of which is not likely to occur, is being discarded for the defect that occurred in the display panel. On the other hand, when the holding member comprises a portion covering a display surface of the display panel, a layer which serves a specific function such as a polarizing plate can be provided at such a portion. Then, when the defect occurs in the display panel, as described above, the display panel and the holding member can be separated and a functional layer such as the polarizing plate can be reused for another display panel, together with the holding member. In this way, the present inventor has newly found that by providing the holding member that holds the display panel on the support with a specific functional layer that is arranged on the display panel in a conventional display apparatus, it is possible to reuse even such a functional layer in addition to the support when it is necessary to replace the display panel, for example.

Next, a display apparatus and a method for manufacturing a display apparatus according to embodiments of the present invention will be described with reference to the drawings. Materials, shapes of the constituting elements, and their relative positions or the like according to the below-described embodiments are merely examples. The display apparatus and the method for manufacturing the display apparatus according to the present invention are not to be construed to be limited thereto.

Embodiment 1

Figure 1B:
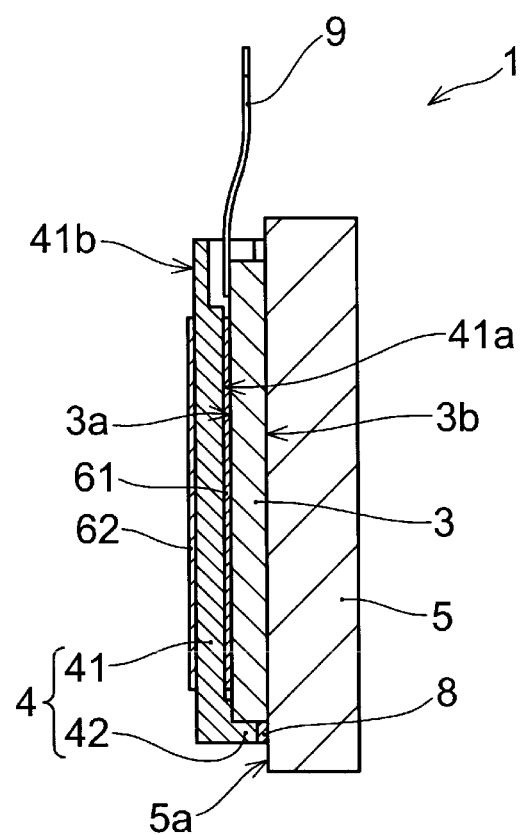
FIG. 1B shows a cross-sectional view along a line IB-IB of FIG. 1A.

FIG. 1A shows a front view of a display apparatus 1 according to Embodiment 1. FIG. 1B shows a cross-sectional view along a line IB-IB of FIG. 1A. The display apparatus 1 comprises: a display panel 3 to control emission or transmittance of light to display an image; a support 5 comprising a surface 5a on which the display panel 3 has been placed; and a holding member 4 that is adhered onto the surface 5a of the support 5 and engages with an edge of the display panel 3 to hold the display panel 3 at a given position on the surface 5a of the support 5. The display panel 3 has an opposite surface 3b of a display surface 3a. The opposite surface 3b is directed to the support 5. The display apparatus 1 further comprises a wiring 9 connected to the display panel 3. In FIG. 1B and each of the cross-sectional views referred to in the explanations below, each constituting element is depicted such that it is highlighted as needed in the thickness direction of the display panel 3 for ease of viewing.

Figure 2A:
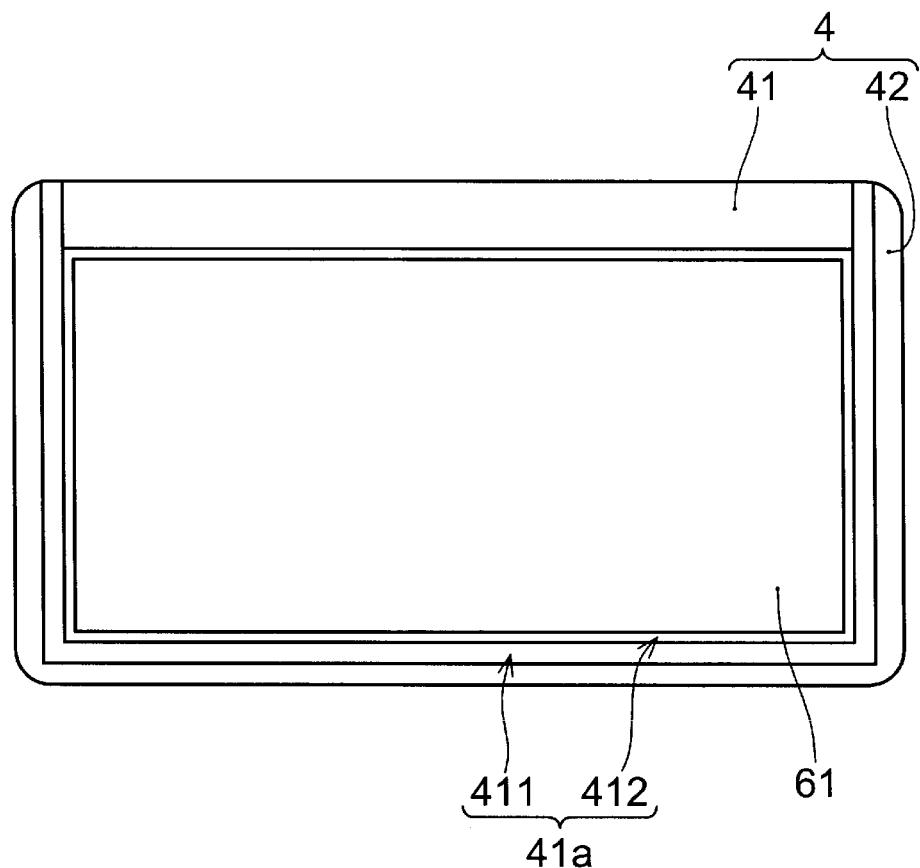
FIG. 2A shows a rear view of one example of a holding member of the display apparatus exemplified in FIG. 1A.
Figure 2B:
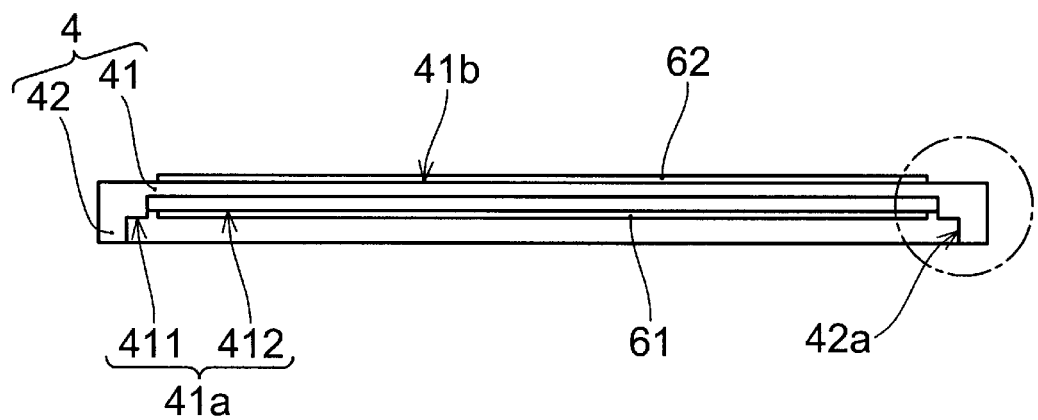
FIG. 2B shows a plan view of the holding member exemplified in FIG. 2A.

FIG. 2A shows a rear view (a rear view when the surface shown in FIG. 1A is made to be a front surface of the holding member 4) of the holding member 4 that is shown in FIGS. 1A and 1B, while FIG. 2B shows a plan view (a view of the holding member 4 from the above in FIG. 2A). The holding member 4 comprises a plate-shaped front surface portion 41 that is formed using a light-transmitting material to cover a display surface 3a (see FIG. 1B) of the display panel 3; and a frame portion 42 that comprises a rod-shaped member that is protruded from a first surface 41a of the front surface portion 41 and provided along an edge of the front surface portion 41. The first surface 41a is directed to the display surface 3a of the display panel 3. Then, the front surface portion 41 comprises a first functional layer 61 on a first surface 41a or on a second surface 41b that is opposite the first surface 41a. The first functional layer 61 has a given function related to propagation of light. In the examples in FIGS. 1A, 1B, 2A, and 2B, the holding member 4 comprises the first functional layer 61 on the first surface 41a and a second functional layer 62 on the second surface 41b. The second functional layer 62 has a given function related to propagation of light. The second functional layer 62 preferably has a function different from a function that the first functional layer has. The second functional layer 62 does not have to be provided, in which case the first functional layer 61 can be provided at either of the first surface 41a and the second surface 41b.

Here, "function" in "has a given function related to propagation of light" can be a function among various functions. For example, a function of a polarizing plate in which only a polarization which has a particular regularity on the direction of vibrations of the electric and magnetic fields (a linear polarization, a circular polarization, or an elliptical polarization) is transmitted, a function of antireflection that suppresses reflection of light, a function of selective reflection that reflects light of a specific wavelength, a function of selective absorption that absorbs light of a specific wavelength, and a function of selective transmission that only transmits light of a specific wavelength can be exemplified. The first functional layer 61 and the second functional layer 62 (and the below-described third functional layer) can have any of the functions exemplified herein, and can have arbitrary functions other than those exemplified herein, that are related to propagation of light. Moreover, each functional layer can have functions which directly act in relation to propagation of light (optical functions) or functions which indirectly act in relation to propagation of light.

Here, "directly" in "functions which directly act in relation to propagation of light" means modes of action in which transmission, reflection, or absorption of light such as the previously-described function of the polarizing plate and each of functions of antireflection, selective reflection, selective absorption, and selective transmission is caused on the propagation of light by each functional layer. Moreover, "indirectly" in "functions which indirectly act in relation to propagation of light" means modes of action via suppression or enhancement of materials that can act in relation to propagation of light. For example, as the "functions which indirectly act in relation to propagation of light", a function to suppress adhering or generating of dust, dirt, or flaw that can unintentionally cause reflection or absorption of light in the front surface portion 41 of the holding member 4 can be exemplified. Therefore, such a function can be an antistatic function, an antifouling function, a surface protecting function, or other functions that indirectly act in relation to propagation of light.

As the display panel 3, an organic-EL display panel or a liquid crystal display panel is exemplified. However, the display panel 3 is not construed to be limited thereto. The display panel 3 exemplified in FIGS. 1A and 1B has a rectangular shape in the display surface 3a and, at two short sides and a lower side of two long sides of the rectangular shape, abuts the holding member at the side surface and the display surface 3a. Therefore, the display panel 3 is restricted by the holding member 4 with respect to the movement along the long-side direction and with respect to the movement in the orientation of the arrow Y drawn from an upper side to a lower side in parallel with a short-side direction of the display panel 3 in FIG. 1A. The holding member 4 is adhered to the support 5 using an adhesive 8. Moreover, the movement of the display panel 3 in an orientation opposite the orientation of the arrow Y is restricted by gravity when the display apparatus 1 is arranged such that the lower side of the display panel 3 in FIG. 1A is located below the upper side of the display panel 3 in FIG. 1A in the vertical direction. As a result, the display panel 3 can be fixed at a given position on the surface 5a of the support 5.

On the other hand, the display panel 3 itself is not adhered onto the support 5. Therefore, at the time of normal use of the display apparatus 1, the display panel 3 can be held on the support 5 and can be easily removed from the support 5 as needed. For example, the display panel 3 can be moved to outside the holding member 4 in an orientation opposite the orientation of the arrow Y shown in FIG. 1A to remove the display panel 3 from the support 5. Therefore, when a defect occurs in either one of the support 5 and the display panel 3, a defect-free support 5 or display panel 3 can be reused.

Moreover, according to the present embodiment, the holding member 4 comprises at least the first functional layer 61 on the first surface 41a or the second surface 41b of the front surface portion 41. In the examples in FIGS. 1A and 1B, the first functional layer 61 is arranged on the first surface 41a, while the second functional layer 62 is arranged on the second surface 41b. As described above, the first functional layer 61 and the second functional layer 62 can have various functions. For example, the first functional layer 61 or the second functional layer 62 can comprise an antireflection layer configured to prevent reflection of light or a polarizing plate. For example, a linearly polarizing plate provided in an opposing substrate positioned to oppose a TFT (thin-film transistor) substrate on which a drive transistor is formed in a conventional liquid crystal display panel can be provided at the holding member 4 as the first functional layer 61. Alternatively, a circularly polarizing plate arranged on a light-emitting surface of the organic-EL display panel can be provided as the first functional layer 61. In this way, arrangement of at least one polarizing plate at the display panel 3 can be omitted. Then, when a defect occurs in the display panel 3, a linearly polarizing plate provided as the first functional layer 61 can be reused in another display panel, together with the holding member 4 and the second functional layer 62.

When the first functional layer 61 comprises the polarizing plate, the second functional layer 62 can be an antireflection layer configured to suppress reflection of light. For example, an antireflection film that is formed on the display surface of a conventional organic-EL display panel to prevent visibility from lowering due to reflection of light can be provided at the holding member 4 as the second functional layer 62. In this way, forming of the antireflection film at the display panel 3 can be omitted. Then, when a defect occurs in the display panel 3, the antireflection film provided as the second functional layer 62 can be reused for another display panel, together with the holding member 4 and the first functional layer 61. As described above, only the first functional layer 61 can be provided in the holding member 4. In this case, the first functional layer 61 that comprises the antireflection layer can be provided on the second surface 41b of the front surface portion 41.

When the polarizing plate is provided as the first functional layer 61 or the second functional layer 62, a commercially-available polarizing plate can be adhered to the front surface portion 41. For example, a linear polarizing plate comprising a structure in which a layer consisting predominantly of polyvinyl alcohol with an iodine compound adsorbed and aligned is sandwiched between two cellulose triacetate films is adhered to the front surface portion 41. Moreover, a circularly polarizing plate in which a ¼ retardation plate formed by polycarbonate is laminated on such a linearly polarizing plate can be adhered to the front surface portion 41. The polarizing plate provided as the first functional layer 61 or the second functional layer 62 is preferably provided on the first surface 41a of the holding layer 62.

When the first functional layer 61 or the second functional layer 62 is an antireflection layer, such an antireflection layer is formed using, for example, a dielectric material having a refractive index n, which is lower than a refractive index of a material forming the front surface portion 41 of the holding member 4. Then, each of the functional layers 61 and 62 is formed with a thickness such that light reflecting on each of front and back surfaces of each of the functional layers 61 and 62 weaken each other by interference. As a thickness d of one layer formed by a dielectric material, a thickness is selected such that a relationship (length L (=n×d)=(¼)×λ) is satisfied. The length L is an optical path length of light in the one layer (for example, light having a wavelength λ) within the visible light range. The first functional layer 61 and the second functional layer 62, when they are antireflection layers, can comprise a multi-layer structure including a plurality of layers formed of a dielectric material. In this way, reflection of lights in a wide wavelength range can be suppressed efficiently. The antireflection layer provided as the first functional layer 61 or the second functional layer 62 is preferably provided on the second surface 41b of the holding member 4.

When the first functional layer 61 or the second functional layer 62 has a selective reflection function, for example, a function reflecting infrared rays as described above, each functional layer comprises a multi-layer structure in which materials having mutually different refractive indices are alternately laminated, for example. Each of the layers formed by materials having mutually different refractive indices, for example, titanium oxide ($TiO_2$) and silicon dioxide ($SiO_2$), or zinc sulfide (ZnS) and magnesium fluoride ($MgF_2$) is formed with a thickness such that reflecting lights of the infrared region on the interface of each layer enhance each other. The infrared rays are reflected, making it possible to suppress an increase in temperature of the display panel 3 and, thus, making it possible to alleviate degradation of characteristics and deterioration in quality of the display panel 3. A film having a function of selective reflection relative to infrared rays and provided as the first functional layer 61 or the second functional layer 62 is preferably provided on the second surface 41b of the holding member 4.

Moreover, when the first functional layer 61 or the second functional layer 62 has an ultraviolet-ray absorbing function as the previously-described selective absorption function, each functional layer is formed by a resin having an ultraviolet-ray absorbing agent added, such as a polycarbonate resin or an acrylic resin. As the ultraviolet-ray absorbing agents, a benzophenone derivative, a salicylate ester derivative, a triazole derivative, an acrylic derivative, or the like are exemplified. Ultraviolet rays can be absorbed to alleviate stress onto organic elements due to the ultraviolet rays when the display panel 3 is an organic-EL display panel. Moreover, the first functional layer 61 or the second functional layer 62 that has the previously-described selective transmission function can be formed by combining a layer having the selective absorption function and a layer having the selective reflection function as described above.

Material and shape of the support 5 are construed to be not limited as long as it can appropriately support the display panel 3. The support 5 can be formed using an arbitrary material such as glass, a metal, or a synthetic resin. Moreover, the support 5 can be a glass plate used for a casing of various devices, a window pane of a residence, a show window, or a display case. Moreover, the support 5 can be a windshield of an automobile, in which case the surface 5a is preferably a surface of the windshield that is directed to a vehicular compartment.

A wiring 9 is provided at the display apparatus 1 to connect the display panel 3 and a display driver (not shown) that supplies a drive signal to the display panel 3. The wiring 9 is connected to a connecting pad (not shown) provided on the display surface 3a at one end of the wiring 9 using an anisotropic conductive film (ACF). As shown in FIGS. 1A and 1B, a portion connecting the wiring 9 and the display panel 3 is housed in a space surrounded by the holding member 4 and the support 3 and is covered by the front surface portion 41 of the holding member 4. The wiring 9 is drawn to the outside of the holding member 4 via a discontinuous portion of the frame portion 42 of the holding member 4. While a flexible printed circuit board (FPC) can be exemplified as the wiring 9, an arbitrary wiring member can be used as the wiring 9.

The adhesive 8 is not construed to be limited as long as it has an adhesive strength with which the holding member 4 can be stably joined to the support 5. An arbitrary epoxy adhesive or acrylic adhesive can be used for the adhesive 8. For example, an arbitrary adhesive such as an acrylic, silicone, or urethane adhesive, known as an optical clear adhesive (OCA) or an optical clear resin (OCR), can be used for the adhesive 8.

As shown in FIGS. 1A, 1B, 2A, and 2B, the holding member 4 comprises the front surface portion 41 that has a substantially rectangular front shape and that has the first surface 41a and the second surface 41b; and the frame portion 42 that is protruded from the first surface 41a at an edge of the front surface portion 41. In the example of FIGS. 2A and 2B, the front surface portion and the frame portion 42 are integrally formed. However, the front surface portion 41 and the frame portion 42 can be separately formed and then connected to each other (see FIG. 11B). In the example shown in, for example, FIG. 2A, the frame portion 42 is formed along each of both short sides and a lower side that is one of long sides of the substantially-rectangular front surface portion 41. Then, the frame portion 42 comprises a discontinuous portion at a portion of an edge of the front surface portion 41 (an upper side of the surface portion 41 in FIG. 2). As a result, as shown in FIG. 2B, a notch 42a is formed on a side surface (which is drawn at the front in FIG. 2B), of the holding member 4, that formed of the frame portion 42. The notch 42a is formed with a size such that the display panel 3 can be inserted therethrough. Providing the notch 42a of such a size makes it possible to remove the display panel 3 from the support 5 as needed while adhering the holding member 4 to the support 5.

The first surface 41a of the front surface portion 41 of the holding member 4 abuts the display surface 3a of the display panel 3 at the immediate inside of the frame portion 42. Moreover, the further inside of an abutting portion 411 that abuts the display panel 3 in the first surface 41a is concave toward the second surface 41b rather than the abutting portion 411. The first functional layer 61 is provided at this concave portion 412. The display surface 3a of the display panel 3 is preferably in contact with, for example, the first functional layer 61 that can be provided on the first surface 41a of the holding member 4. This is because, if there is a gap between the display surface and the functional layer, reflection of external light occurs, or transmittance of light from the display panel 3 thereby decreases to cause a decrease in visibility. Therefore, the depth of the concave portion 412 is selected such that a surface of the first functional layer 61 that is directed to the display panel 3 and the abutting portion 411 of the first surface 41a of the holding member 4 are substantially on the same plane. When there is a gap between the display surface 3a of the display panel 3 and the first functional layer 61 that can be provided on the first surface 41a, the gap is preferably filled with a filling material having substantially the same refractive index as the refractive index of the first functional layer 61.

Figure 3A:
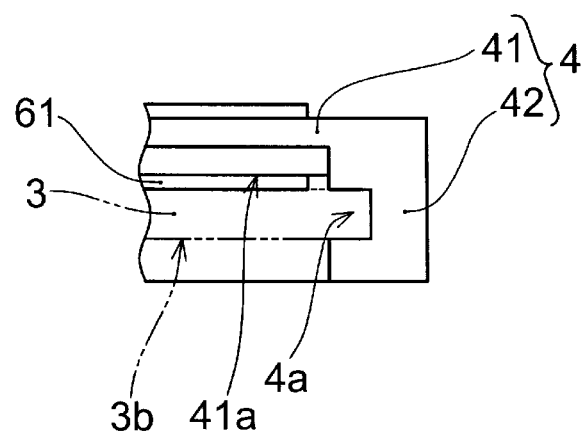
FIG. 3A shows a partially-enlarged view of another example of the holding member exemplified in FIG. 2A.
Figure 3B:
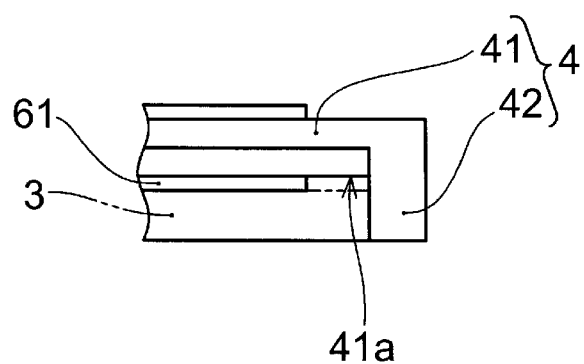
FIG. 3B shows a partially-enlarged view of yet another example of the holding member exemplified in FIG. 2A.

FIGS. 3A and 3B show variations of the shape of an inner wall of the frame portion 42 of the holding member 4 that are exemplified in FIGS. 2A and 2B. FIGS. 3A and 3B show enlarged views of a portion corresponding to a portion surrounded by a chain line in FIG. 2B. In the example shown in FIG. 3A, a groove 4a is formed at the inner wall of the frame portion 42. An edge of the display panel 3 is inserted into the groove 4a, and the opposite surface 3b of the display surface of the display panel 3 also abuts the holding member 4 at the edge of the display panel 3. Therefore, it is possible to prevent the result of contact between the display panel 3 and the first functional layer 61 provided on the first surface 41a of the holding member 4 from being influenced by variations in the thickness of the adhesive 8 (see FIG. 1B).

However, as shown in FIG. 3B, the holding member 4 does not have to comprise the groove 4a as shown in FIG. 3A in the inner wall of the frame portion 42, and, moreover, does not have to comprise the abutting portion 411 that abuts the display panel 3 at the first surface 41a as shown in FIGS. 2A and 2B. In other words, the first surface 41a does not necessarily need to comprise the concave portion 412 as shown in FIG. 2B. In the example shown in FIG. 3B, the movement in which the display panel 3 separates from the support 5 (see FIG. 1B) can be restricted by abutting the first functional layer 61 or by friction with the inner wall of the frame portion 42.

At the front surface portion 41 of the holding member 4, at least a portion covering an image displayed on the display panel 3 is formed using a light-transmitting material. For example, the front surface portion 41 is formed using glass, or a transparent silicone rubber having flexibility. Using the transparent silicone rubber makes it possible to adhere the holding member 4 to the support 5 without causing excessive stress on the front surface portion 41 even when the surface 5a of the support 5 is a curved surface such as the surface of a windshield of an automobile. Except for the portion covering the image of the display panel 3, the holding member 4 can be formed of an arbitrary material. For example, a synthetic resin such as an epoxy resin or a commodity plastic, a natural resin such as a natural rubber, or a rubber sponge can be used as a material for the holding member 4. However, the holding member 4 is preferably formed of a material having flexibility as well as elasticity not only for the previously-described front surface portion 41 but for the whole holding member 4. Moreover, the holding member 4 can be formed using a light-transmitting material such as the previously-described transparent silicone rubber, acrylic resin, transparent PC (polycarbonate) resin, transparent PET (polyethylene terephthalate), or transparent MS (polymethacryl styrene) not only for the previously-described front surface portion 41 but for the whole holding member 4. In this way, it can be made difficult to see the holding member 4 for a person viewing the display apparatus 1.

Figure 4:
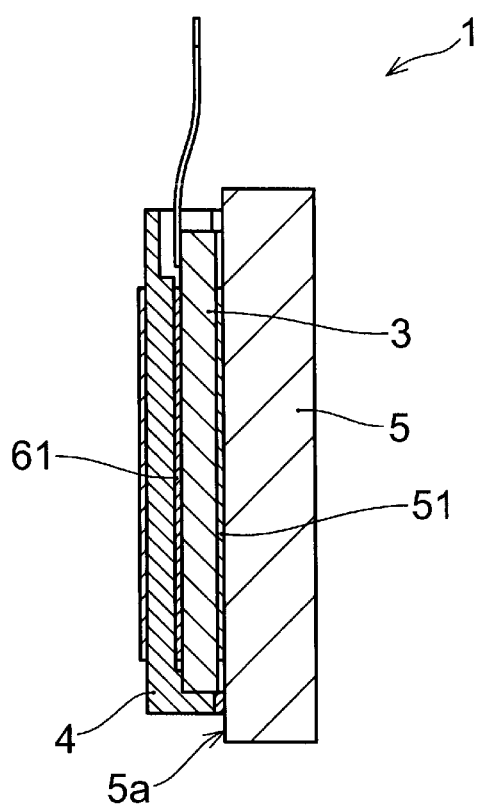
FIG. 4 shows a cross-sectional view of another example of the display apparatus according to Embodiment 1 of the present invention.

FIG. 4 shows another example of the display apparatus 1 according to the present embodiment. As shown in FIG. 4, a polarizing plate 51 can be provided on the surface 5a of the support 5, separately from a polarizing plate that can be provided as the first functional layer 61 provided at the holding member 4. For example, providing a linearly polarizing plate on the surface 5a of the support 5 as the polarizing plate 51 makes it possible to omit a linearly polarizing plate which may be provided in the TFT substrate in the conventional display panel when the display panel 3 is a liquid-crystal display panel. In the example in FIG. 4, when a linearly polarizing plate is provided as the first functional layer 61, the polarization axis of the linearly polarizing plate that is provided as the first functional layer 61 and the polarization axis of the linearly polarizing plate that is provided as the polarizing plate 51 can be orthogonal, or can be parallel to each other. Moreover, the polarization axes of these linearly polarizing plates can be inclined by degrees relative to each other. When the polarizing plate 51 is provided in the support 5, the polarizing plate 51, together with the holding member 4 and the support 5, can be reused for another display panel when a defect occurs in the display panel 3. In addition to or instead of the polarizing plate 51, a functional layer (not shown) which has infrared ray reflective function or ultraviolet ray absorbing function each described above for the first functional layer 61 can be provided. For example, when the support 5 is a windshield of an automobile, infrared rays included in sunlight can be reflected, or ultraviolet rays included therein can be absorbed to reduce stress on the display panel 3.

Figure 5A:
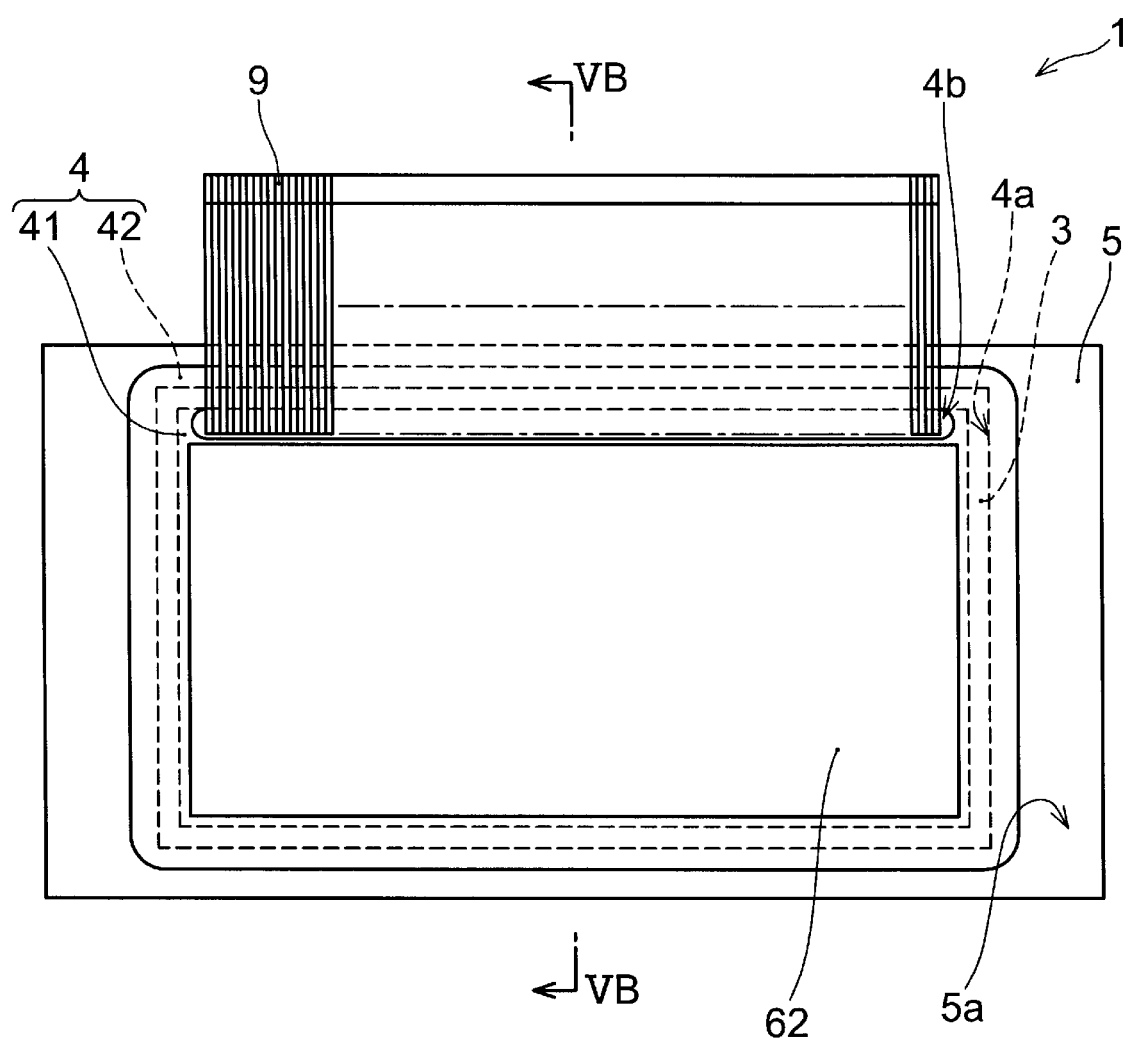
FIG. 5A shows a front view of yet another example of the display apparatus according to Embodiment 1 of the present invention.
Figure 5B:
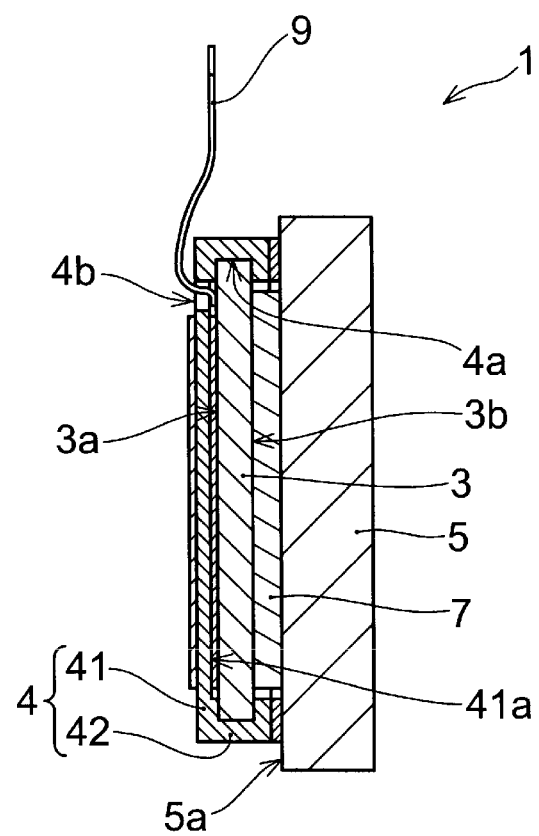
FIG. 5B shows a cross-sectional view along a line VB-VB of FIG. 5A.

FIGS. 5A and 5B show yet another example of the display apparatus 1 according to the present embodiment. In the examples in FIGS. 5A and 5B, the display panel 3 having a generally rectangular front shape abuts the holding member 4 at a side surface, a display surface 3a, and an opposite surface 3b of the display surface 3a in any of two long sides and two short sides of the above-mentioned rectangular shape. In other words, the frame portion 42 of the holding member 4 is continuous with no break at the edge of the front surface portion 41 and surrounds the whole periphery of the display panel 3. Moreover, as with the example in FIG. 3A, the frame portion 42 has a groove 4a at the inner wall and the edge of the display panel 3 is inserted into the groove 4a. Therefore, the movement of the display panel 3 in an orientation separating from the surface 5a and the movement of the display panel 3 in an arbitrary direction along the surface 5a of the support 5 can be restricted by the holding member 4. Moreover, as described previously with reference to FIG. 3A, the result of contact between the display panel 3 and the first functional layer 61 is not influenced by variations in the thickness of the adhesive 8. In the display apparatus exemplified in FIGS. 5A and 5B, a solvent or the like can be used to soften the adhesive 8 and separate the holding member 4 and the support 5 as needed to remove the holding member 4 from the support 5.

As shown in FIG. 5B, a weak adhesive layer 7 formed of an adhesive is provided at a space between the display panel 3 and the support 5, which space can be produced using the holding member 4 comprising a groove 4a. The weak adhesive layer 7 ensures that the display panel 3 and the support 5 tightly adhere to each other. Therefore, lifting of the display panel 3 during use of the display apparatus 1 or an entrainment of air bubble into the interface between the display panel 3 and the support can be prevented. "Weak adhesion" refers to the adhesion to an extent enough to adhere to an adhesion object tightly and yet to be released easily from the adhesion object when subjected to a force in a releasing orientation without causing any damage to the adhesion object or leaving any glue on the adhesion surface. A weak adhesion layer 7 is formed of an adhesive containing an acrylic resin, a silicone resin, or an urethane resin as a single substance or containing a combination of a plurality thereof as a main component, for example.

Moreover, in the examples in FIGS. 5A and 5B, the holding member 4 engages with the edge of the display panel 3 along the whole periphery of the display panel 3, so that the wiring 9 connected to the display surface 3a is drawn to the outside of the holding member 4 via an aperture 4b formed at the front surface portion 41 of the holding member 4. The aperture 4b is provided at a position corresponding to a portion at which the wiring 9 is joined to the display panel 3 and has an elliptical front shape.

Figure 6A:
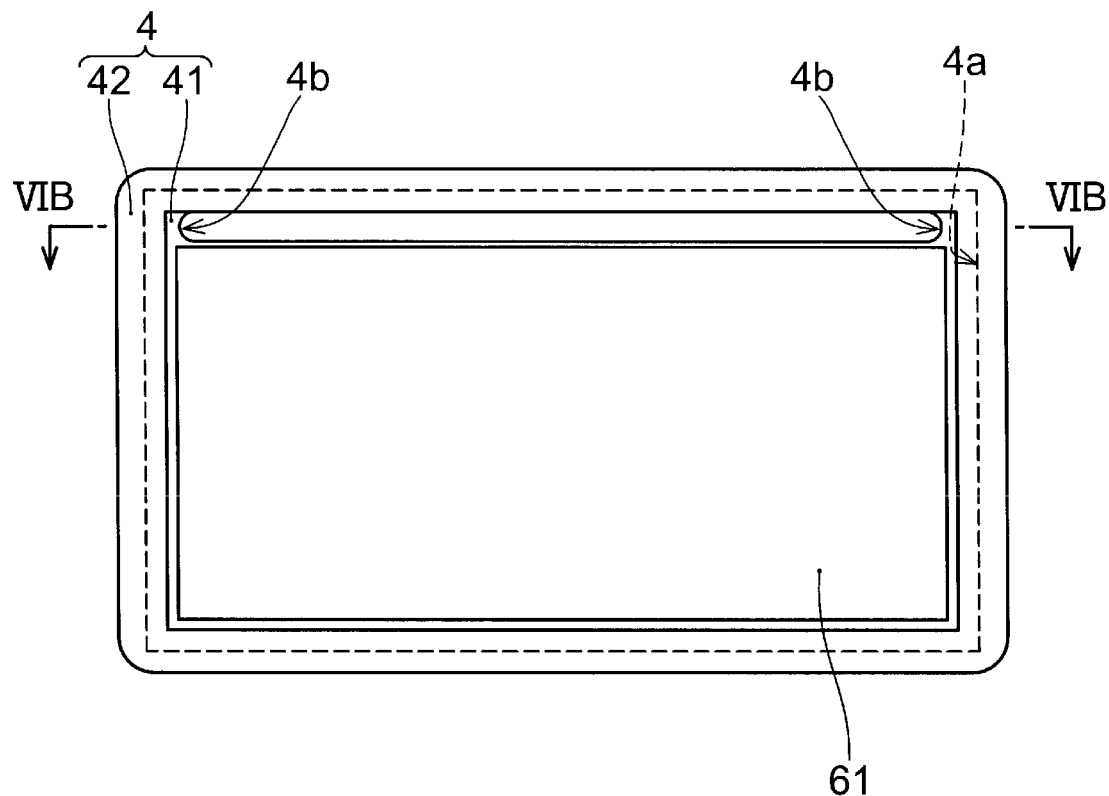
FIG. 6A shows a rear view of one example of the holding member of the display apparatus exemplified in FIG. 5A.
Figure 6B:
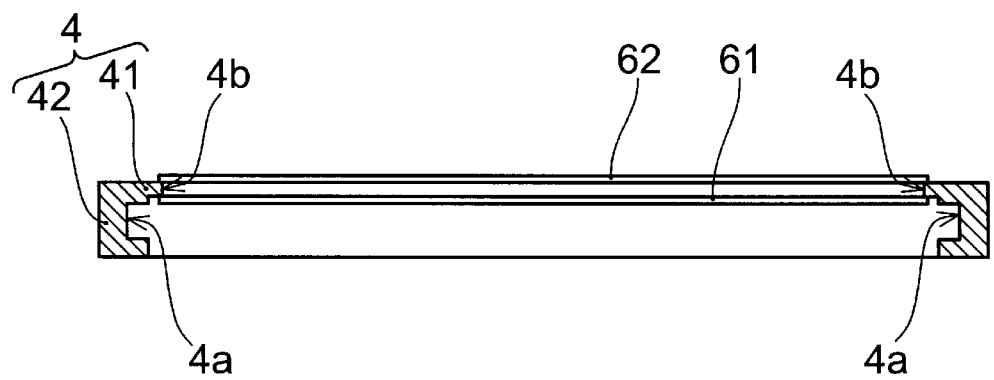
FIG. 6B shows a cross-sectional view along a line VIB-VIB of FIG. 6A.

FIG. 6A shows a rear view (a rear view with the surface shown in FIG. 5A as the front of the holding member 4) of the holding member 4 shown in FIGS. 5A and 5B, while FIG. 6B shows a cross-sectional view along a line VIB-VIB of FIG. 6A. The aperture 4b is formed in the vicinity of one long side of the holding member 4 having a generally rectangular front shape. The aperture 4b is formed such that a direction along the one long side corresponds to the longitudinal direction of the aperture 4b. The aperture 4b is preferably not formed at a portion of the front surface portion 41 that covers an image displayed at the display panel 3 (see FIG. 5B). Therefore, the first functional layer 61 and the second functional layer 62 can be provided at the portion which covers the image displayed at the display panel 3. Moreover, a groove 4a is formed at the inner wall of the frame portion 42 over the whole periphery of the frame portion 42. Except for the frame portion 42 being formed at the holding member 4 over the whole periphery thereof, the aperture 4b being formed at the front surface portion 41 and the weak adhesion layer 7 being provided in between the support 5 and the display panel 3, the display apparatus 1 shown in FIGS. 5A and 5B is the same as the display apparatus 1 shown in FIGS. 1A and 1B. Repetitive explanations for configurations which are the same as those of the examples in FIGS. 1A and 1B will be omitted.

Embodiment 2

Figure 7:
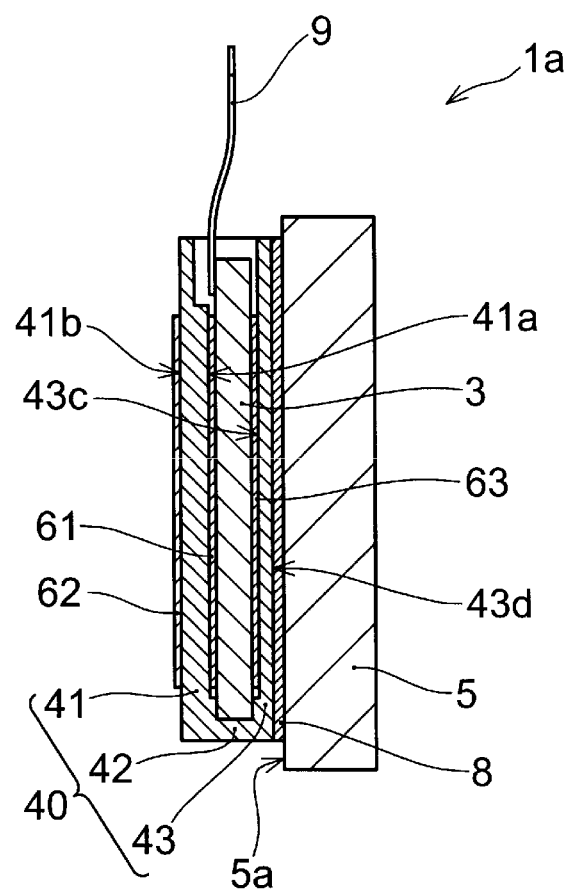
FIG. 7 shows a cross-sectional view of one example of the display apparatus according to Embodiment 2 of the present invention.
Figure 8A:
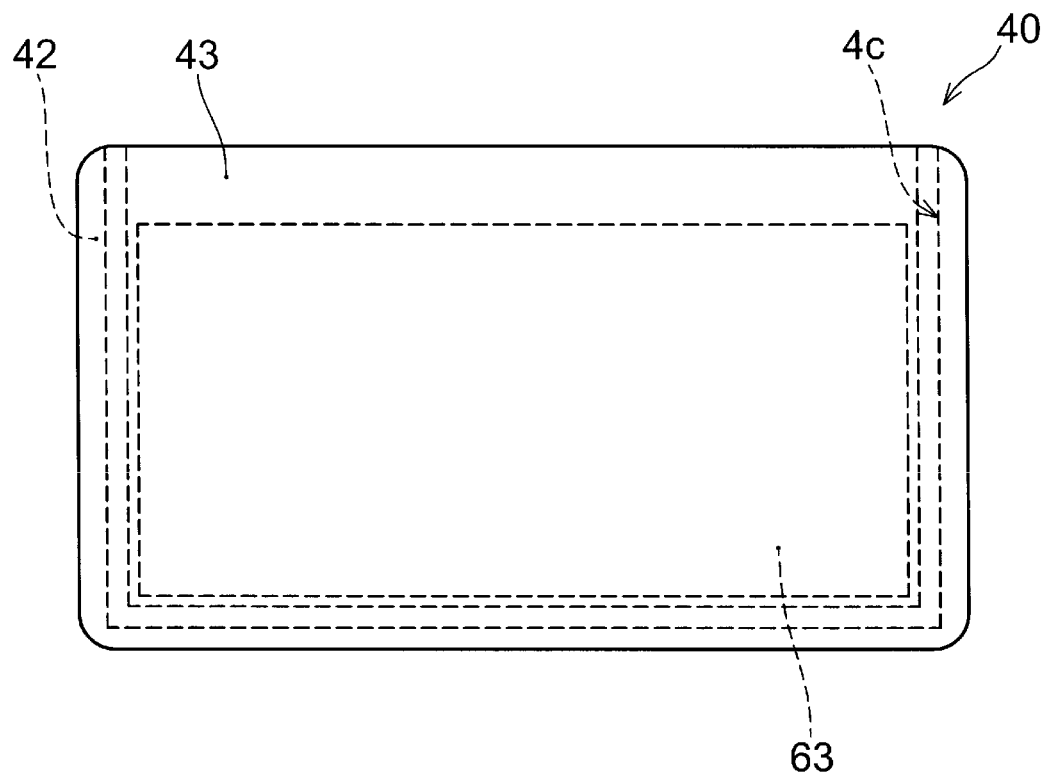
FIG. 8A shows a rear view of one example of the holding member of the display apparatus exemplified in FIG. 7.
Figure 8B:
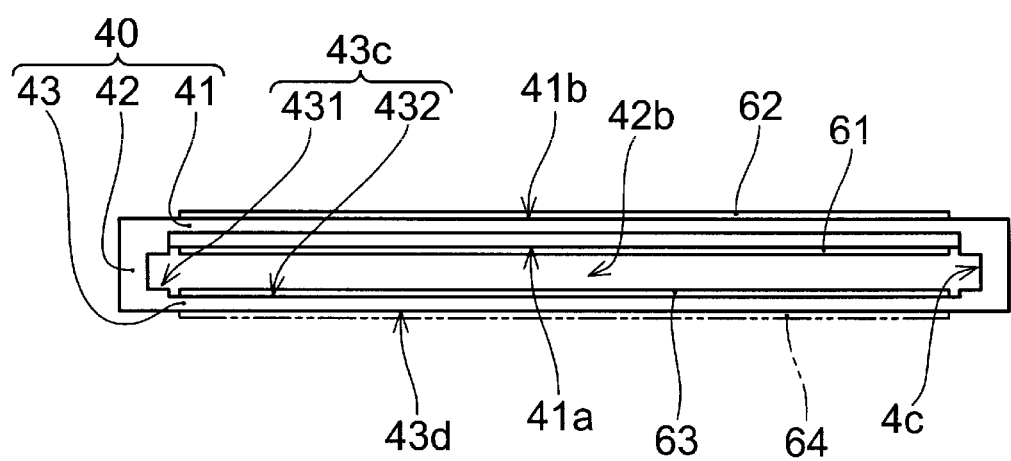
FIG. 8B shows a plan view of the holding member exemplified in FIG. 8A.

FIG. 7 shows a cross-sectional view of a display apparatus 1a according to Embodiment 2. FIG. 7 shows a cross section corresponding to the cross section shown in FIG. 1B for the display apparatus 1 according to the previously-described Embodiment 1 for the display apparatus 1a according to Embodiment 2. Moreover, FIG. 8A shows a rear view (a rear view with a surface directed to the support 5 in FIG. 7) of a holding member 40 shown in FIG. 7 and FIG. 8B shows a plan view (a view in which the holding member 40 is viewed from above in FIG. 8A) of the holding member 40. As shown in FIGS. 7, 8A, and 8B, the holding member 40 comprises a front surface portion 41 and a frame portion 42 in the same manner as the holding member 4 used in the previously-described Embodiment 1 and further comprises a plate-shaped back surface portion 43. The back surface portion 43 is connected to the front surface portion 41 via the frame portion 42 so as to be spaced from and face the first surface 41a of the first surface portion 41. The holding member 40 has the back surface portion 43 adhered onto the surface 5a of the support 5. In the example of FIG. 7, the whole surface of the holding member 40 that is directed to the support 5 is adhered onto the surface 5a of the support 5 using the adhesive 8. The display panel 3 is positioned between the front surface portion 41 and the back surface portion 43 of the holding member 40. The display apparatus 1a according to Embodiment 2 is the same as display apparatus 1 according to Embodiment 1 that is exemplified in FIGS. 1A and 1B except that the holding member 40 comprises the back surface portion 43. Therefore, for the constituting elements that are the same as those of the display apparatus 1 according to Embodiment 1, the same reference numerals as those given to FIG. 1A or the like are given to FIGS. 7, 8A, and 8B, and repetitive explanations will be omitted.

In the example of FIG. 7, the back surface portion 43 comprises a third functional layer 63 having a given function related to propagation of light on a third surface 43c facing the first surface 41a of the front surface portion 41. Unlike the example of FIG. 7, the back surface portion 43 can comprise the third functional layer 63 on a surface (a fourth surface) 43d that is opposite the third surface 43c. The given function that the third functional layer 63 has is exemplified by each of the functions exemplified for the previously-described first functional layer 61 and second functional layer 62. For example, the back surface portion 43 can comprise a polarizing plate as the third functional layer 63 on the third surface 43c. When the third functional layer 63 is a linearly polarizing plate, for example, a linear polarizing plate conventionally provided at a TFT substrate can be omitted in a liquid-crystal panel placed as the display panel 3 on the surface 5a of the support 5. In the example of FIG. 7, when the linearly polarizing plate is provided as the first functional layer 61, the polarization axis of the linearly polarizing plate provided as the first functional layer 61 and the polarization axis of the linearly polarizing plate provided as the third functional layer 63 can be orthogonal, or can be parallel. Moreover, the polarization axes of each of the linearly polarizing plates can be inclined relative to each other by degrees. The third functional layer 63 can have the previously-described selective reflection function or selective absorption function and can have the same structure as that of the first functional layer 61 having the same function. When a layer having a selective reflection function or selective absorption function, or a polarizing plate is provided, the polarizing plate or the like that is provided as the third functional layer 63, together with the holding member 40 and the support 5, can be reused for another display panel when a defect occurs in the display panel 3.

As shown in FIGS. 8A and 8B, the back surface portion 43 is positioned to face the first surface 41a of the front surface portion 41 and is connected to the front surface position 41 via the frame portion 42. As with the frame portion 42 of the holding member 4 that is exemplified in FIGS. 2A and 2B, the frame portion 42 comprises a discontinuous portion at a portion (an upper side of the back surface portion 43 in FIG. 8A) of an edge of each of the front surface portion 41 and the back surface portion 43. As a result, as shown in FIG. 8B, an aperture 42b is formed on a side surface (which is drawn at the front in FIG. 8B), of the holding member 40, that formed of the frame portion 42. Preferably, the aperture 42b through which the display panel 3 can be inserted is formed. Providing the aperture 42b of such a size makes it possible to remove the display panel 3 from the support as needed while the holding member 40 is adhered to the support 5.

In the example shown in FIGS. 8A and 8B, the third surface 43c of the back surface portion 43 comprises an abutting portion 431 that abuts the display panel 3 (see FIG. 7) immediately inside the frame portion 42 and a concave portion 432 further inside the abutting portion 431. The concave portion 432 is concave toward a fourth surface 43d rather than the abutting portion 431. Then, the third functional layer 63 is provided at the concave portion 432. Preferably, the depth of the concave portion 432 is adjusted such that a surface of the third functional layer 3 that is directed toward the display panel 3 and the abutting portion 431 of the third surface 43c are substantially on the same plane. However, the concave portion 432 is not necessarily provided. A groove 4c is formed inside the side surface of the holding member 40. An edge of the display panel 3 is inserted into the groove 4c. While the first functional layer 61 and the second functional layer 62 are provided on the front surface portion 41 in the example in FIGS. 8A and 8B, at least the first functional layer 61 is provided on the first surface 41a or the second surface 41b. The back surface portion 43 is formed using the same material as either or both of the frame portion 42 and the front surface portion 41. The back surface portion 43 can be formed using a light-transmitting material. Moreover, the back surface portion 43 can be integrally formed with the front surface portion 41 and the frame portion 42, or it can be formed separately therefrom and connected thereto later.

A fourth functional layer 64 having a given function related to propagation of light can be provided at the back surface portion 43 of the holding member 40 as shown with a chain double-dashed line in FIG. 8B in addition to the third functional layer 63. The fourth functional layer 64 is provided on a surface, of the back surface portion 43, opposite a surface (the third surface 43c or the fourth surface 43d) on which the third functional layer 63 is provided. As in the example in FIGS. 7 and 8B, when a polarizing plate is provided as a third functional layer 63 on the third surface 43c, the fourth functional layer 64 having infrared ray reflection function or ultraviolet ray absorption function, for example, can be provided on the fourth surface 43d. As described previously, since the back surface portion 43 of the holding member 40 is adhered to the support 5, the fourth surface 43d is directed to the support 5. When the support 5 is a windshield of an automobile, for example, stress on the display panel 3 due to infrared or ultraviolet rays included in sunlight can be reduced.

[Display Panel]

Figure 9:
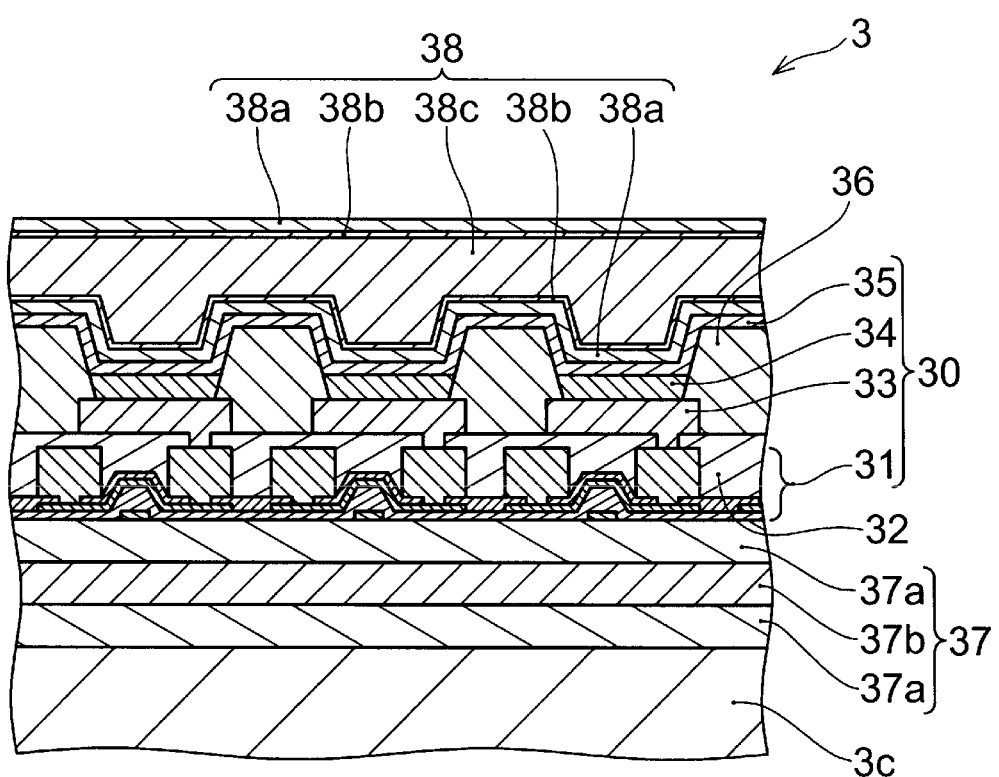
FIG. 9 shows a cross-sectional view of an example of a display panel used in the display apparatus according to embodiments of the present invention.

FIG. 9 shows an example of a cross-sectional structure of an organic-EL display panel used as the display panel 3 according to each of the previously-described embodiments. As shown in FIG. 9, the display panel 3 comprises a substrate 3c and a plurality of display elements 30 formed on the substrate 3c. The substrate 3c is a glass plate, or a resin film formed using a polyimide resin, for example. When the display panel 3 is a transparent organic-EL display panel having flexibility, a transparent polyimide resin, for example, is used as a material for the substrate 3c. Each of the display elements 30 comprises: a TFT 31; a first electrode 33 connected to the TFT 31; an organic layer 34 that is formed by an organic material deposited on the first electrode 33 to emit light; and a second electrode 35 formed on the organic layer 34. Each of the display elements 30 is separated by a bank 36 formed using $SiO_2$ or the like. The first electrode 33 and the bank 36 are formed on a flattening layer 32 covering the TFT 31.

The TFT 31 can be formed using polycrystalline silicon or the like, for example, and a transparent amorphous oxide semiconductor such as an indium-gallium-zinc oxide can be used for a channel layer thereof. Moreover, the TFT 31 can be formed using an organic semiconductor material. The first electrode 33 is formed by a light-transmitting conductive material such as an ITO film, for example. The organic layer 34, which is shown as one layer in FIG. 9, can be actually formed to have a multilayered structure that includes a hole-transport layer, a light-emitting layer, an electron-transport layer or the like. The hole-transport layer is formed with an amine material, for example, the light-emitting layer is formed using a material prepared by doping a host material such as $Alq_3$ or BAlq with a dopant in accordance with the color of light emitted, for example, and the electron-transport layer is formed with $Alq_3$ or the like, for example. The organic layer 34 can further include a hole-injection layer and an electron-injection layer (not shown). The second electrode 35 is formed with a metal having a small work function, such as an Mg—Ag alloy layer or aluminum, for example. The cross-sectional structure shown in FIG. 9 is construed to be merely exemplary, and structures of the organic-EL display panel that makes up the display panel 3 and materials of each of the constituting elements are construed to be not limited to the structures and materials described herein.

In the example shown in FIG. 9, the display panel 3 further comprises a barrier layer formed, using a moisture impermeable material, between the display element 30 and the substrate 3c, and on the display element 30. A first barrier layer 37 is formed between the display element 30 and the substrate 3c and a second barrier layer 38 is formed on the display element 30. Specifically, the first barrier layer 37 is formed between the TFT 31 and the substrate 3c. A water vapor transmission rate of the first barrier layer 37 and the second barrier layer 38 is $1 \times 10^{-4}$ g/m$^2$/day or less, for example. In this way, the first barrier layer 37 and the second barrier layer 38 are provided to protect the organic layer 34 that is likely to deteriorate with a contact with moisture. Moreover, such penetration of moisture as to reach the interface between the display panel 3 and the support 5 (see FIG. 1B) through the display panel 3 is strictly prevented. For example, in a case where the display panel 3 is a transparent organic-EL display panel, when partial lifting of the display panel 3 occurs at the interface between the display panel 3 and the support 5 due to penetration of moisture, color unevenness may occur in an image seen by a person viewing the display panel 3. However, it is possible to prevent such detrimental effects on the image by providing the first barrier layer 37 and the second barrier layer 38 as shown in FIG. 9. Unlike the example in FIG. 9, the display panel 3 can comprise either one of the barrier films 37 and 38 only between the display element and the substrate 3c or only on the display element 30.

In the example in FIG. 9, the first barrier layer is a multilayered layer comprising silicon nitride layers 37a and a silicon oxide layer 37b. The silicon oxide layer 37b is sandwiched between two silicon nitride layers 37a. The first barrier layer 37 can be made as such a multilayered layer to obtain a barrier layer which has high barrier performance and in which a crack is unlikely to occur. However, the first barrier layer 37 can be a single-layer, or can be a multilayered layer including a plurality of layers other than three layers, or can be formed using a material other than silicon nitride and silicon oxide.

Moreover, in the example in FIG. 9, the second barrier layer 38 has a five-layer structure including two silicon nitride layers 38a, two silicon oxide layers 38b, and an organic layer 38c. The organic layer 38c is formed using an epoxy resin or acrylic resin, for example. Unevenness of the surface of the display element 30 and undesired particles (not shown) adhered to the surface of the display element 30 can be embedded in the organic layer 38c that can have flexibility, so that the silicon nitride films 38a or the like can be stably formed on the organic layer 38c. Moreover, by interposing the silicon oxide layer 38b, the adhesion strength between the silicon nitride films 38a and the organic layer 38c can be improved. However, the silicon oxide layer 38b and the organic layer 38c are not necessarily formed, a silicon nitride oxide layer having a high film-forming rate can be provided instead of the silicon nitride layer 38a, and the second barrier layer 38 can be a single-layer, or can be a multilayered layer including a plurality of layers other than five layers.

In each of the previously-described embodiments, a circularly polarizing plate or an antireflection layer that may be provided on a plurality of display elements of the conventional organic-EL display panels can be replaced with the first functional layer 61 or the second functional layer 62 (see FIG. 2B) that is provided at the front surface portion 41 of the holding member 4. Moreover, an infrared ray reflective layer or an ultraviolet ray absorbing layer that may be provided on an upper surface of the substrate on which the TFT is formed (a surface on which the display element is provided) and/or a lower surface (a surface directed in an orientation opposite the display element) can be replaced with the third functional layer 63 or the fourth functional layer 64 (see FIG. 8B) provided at the back surface portion 43 of the holding member 40.

Although not shown, when the display panel 3 is a liquid-crystal display panel, the display panel 3 comprises a first substrate (a previously-described TFT substrate) formed using a glass plate or the like, a second substrate (a previously-described opposing substrate) having flexibility and positioned to be spaced from the first substrate, and a liquid-crystal layer between the first substrate and the second substrate. Moreover, the display panel 3 comprises a TFT formed on the first substrate, a pixel electrode connected to the TFT, and a first alignment film formed on the pixel electrode. Furthermore, the display panel 3 comprises a color filter, a common electrode, and a second alignment film that are provided in order on a surface of the second substrate that is directed to the first substrate. On each of the respective surfaces of the first substrate and the second substrate, which are opposite to a surface facing the liquid-crystal layer, a polarizing plate is provided. These polarizing plates can be replaced with a polarizing plate that can be provided as the first functional layer 61 or the third functional layer 63 of the holding member 4 (see FIG. 2B) or the holding member 40 (see FIG. 8B). The structure of the liquid-crystal display panels that can compose the display panel 3 of the display apparatus 1 or 1a according to each of the previously-described embodiments is construed to be not limited to the structures described herein.

[Method for Manufacturing]

Figure 10:
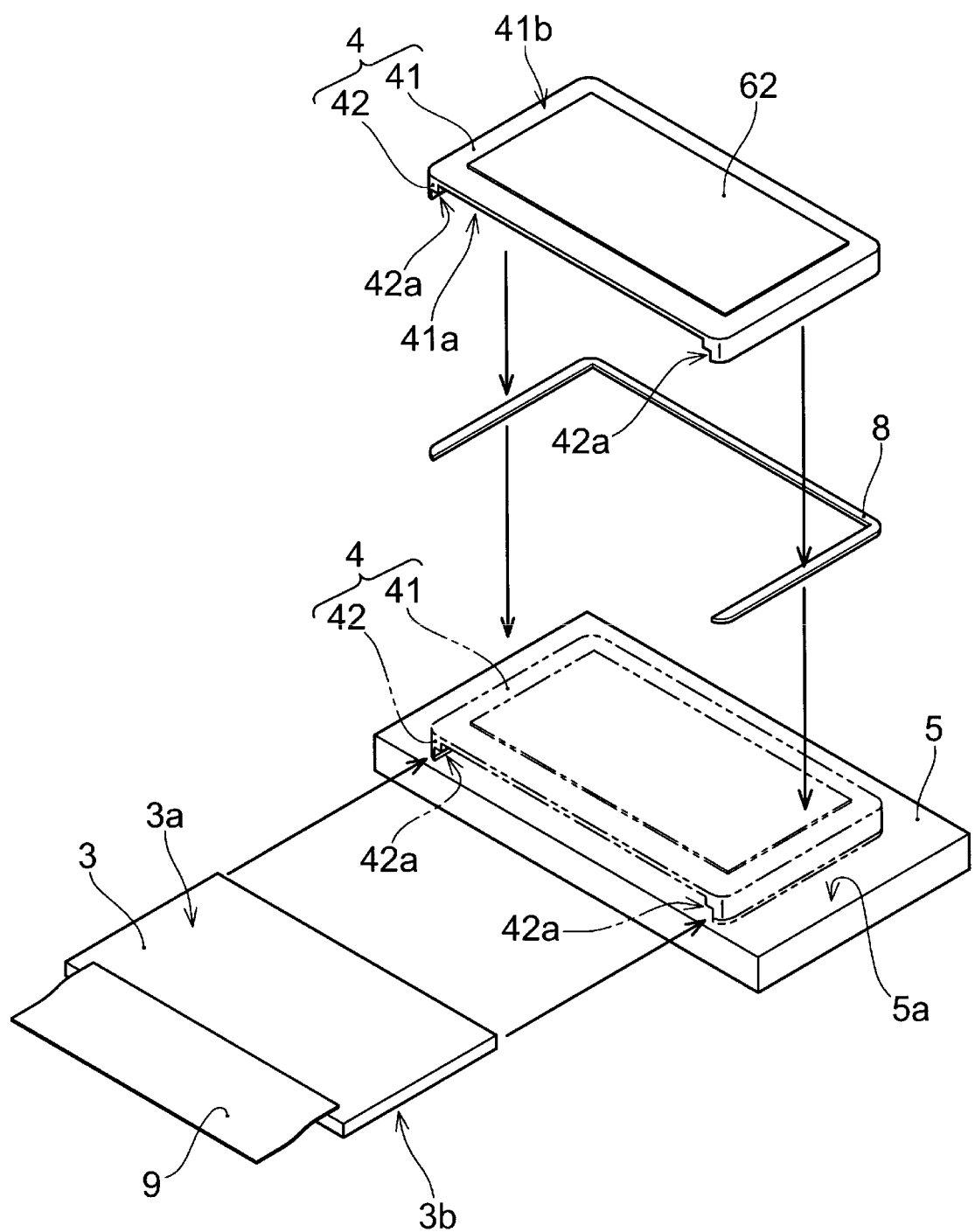
FIG. 10 shows an example of a method for manufacturing of the display apparatus according to Embodiment 3 of the present invention.

Next, a method for manufacturing display apparatus according to Embodiment 3 will be described with reference to the drawings. FIG. 10 shows an overview of the method for manufacturing the display apparatus according to the present embodiment with the display apparatus 1 as an example which is shown in FIG. 1 referred to in the previously-described explanations. As shown in FIG. 10, the method for manufacturing the display apparatus according to the present embodiment comprises: forming the display panel 3 by forming the plurality of display elements 30 (see FIG. 9) on the substrate 3c; preparing the support 5 comprising the surface 5a on which the display panel 3 is to be placed; and preparing the holding member 4 comprising the plate-shaped front surface portion 41 and the frame portion 42 comprising the rod-shaped member provided along an edge of the front surface portion 41. Moreover, the method for manufacturing the display apparatus according to the present embodiment comprises: adhering the holding member 4 onto the surface 5a of the support while directing the first surface 41a of the front surface portion 41 to the support 5; engaging an inner wall of the frame portion 42 of the holding member 4 with an edge of the display panel 3 such that the display surface 3a of the display panel 3 is covered by the front surface portion 41; and placing the display panel 3 on the surface 5a of the support 5 while directing the opposite surface 3b of the display surface 3a to the support 5. Then, the method for manufacturing the display apparatus according to the present embodiment comprises, in the preparing of the holding member 4, forming the front surface portion 41 using a light-transmitting material; and providing the first functional layer 61 having a given function related to propagation of light on the first surface 41a or a second surface 41b of the front surface portion 41, which is opposite the first surface 41a (see FIGS. 11A and 11B). Next, detailed explanations will be provided.

First, forming the display panel 3 will be explained with reference to FIG. 9 again. An organic-EL display panel or liquid-crystal display panel is formed as the display panel 3. When the organic-EL display panel is formed as the display panel 3, the organic-EL display element (display elements 30) including the TFT 31 and the organic layer 34 and the like is formed on the substrate 3c formed of, for example, a polyimide film or a glass plate. At this time, the first barrier layer 37 is preferably formed between the substrate 3c and the display elements 30 using a moisture impermeable material. The moisture impermeable material can include silicon nitride and silicon oxide. In the example in FIG. 9, three layers (the silicon oxide layer 37b, and each of silicon nitride layers 37a at upper and lower sides of the silicon oxide layer 37b) are formed on the substrate 3c to form the first barrier layer 37. The silicon nitride layers 37a and the silicon oxide layer 37b are formed using plasma-enhanced chemical vapor deposition (PECVD) or sputtering, for example.

The TFT 31, the first electrode 33, the second electrode 35, and the organic layer 34 that compose the organic-EL display element can be formed with an arbitrary method including a well-known method, so that detailed explanations thereof are omitted. Moreover, when the liquid-crystal display panel is formed as the display panel 3, each of the electrodes, an alignment film, a polarizing plate, and a liquid-crystal layer that compose the liquid crystal display element can be formed with an arbitrary method including a well-known method, so that detailed explanations thereof are omitted.

After the display elements 30 are formed, the second barrier layer 38 is preferably formed on the display elements 30 using a moisture impermeable material. In the example in FIG. 9, a silicon nitride layer 38a, a silicon oxide layer 38b, and an organic layer 38c are formed in order on the display elements 30, and again the silicon oxide layer 38b and the silicon nitride layer 38a are formed. The silicon nitride layer 38a and the silicon oxide layer 38b are formed with PECVD or sputtering, for example. The organic layer 38c is formed by printing an epoxy resin or an acrylic resin using an inkjet printer, for example. When the second barrier layer 38 is formed, only the silicon nitride layer 38a and the organic layer 38c can be formed, for example. In this way, in the method for manufacturing the display apparatus according to the present embodiment, in forming the display panel 3, the barrier layers (the first barrier layer 37 and the second barrier layer 38) can be formed at either one of or both of between the substrate 3c and the display elements 30 and on the display elements 30 using a moisture impermeable material.

FIG. 10 is referred to again. The holding member 4 is prepared by appropriately processing a material such as a synthetic resin or a natural resin. The holding member 4 is formed by machining or by molding or press processing using an appropriately manufactured die so as to comprise the plate-shaped front surface portion 41 and the frame portion 42 comprising the rod-shaped member provided in such a manner that the rod-shaped member is protruded from the first surface 41a of the front surface portion 41 along the edge of the front surface portion 41. The first surface 41a of the front surface portion 41 of the holding member 4 is a surface other than a side surface of the plate-shaped front surface portion 41, and is a surface to be directed to the display panel 3 and the support 5 in the display apparatus 1. In the example in FIG. 10, a discontinuous portion is provided at the frame portion 42 to provide the notch 42a on the side surface of the holding member 4. For example, a die used in forming the holding member 4 can be appropriately manufactured to provide the holding member 4 with the notch 42a. As described later, the display panel 3 is moved to a given placement position inside the frame portion 42 from outside the frame portion 42 through the notch 42a.

In preparing the holding member 4, at least a portion of the front surface portion 41, which covers an image displayed on the display panel 3 is formed using a light-transmitting material. For example, the entire holding member 4 can be integrally formed by die molding using a transparent silicone rubber, an acrylic resin, a transparent PC resin, a transparent PET resin, a transparent MS resin, or the like.

Figure 11A:
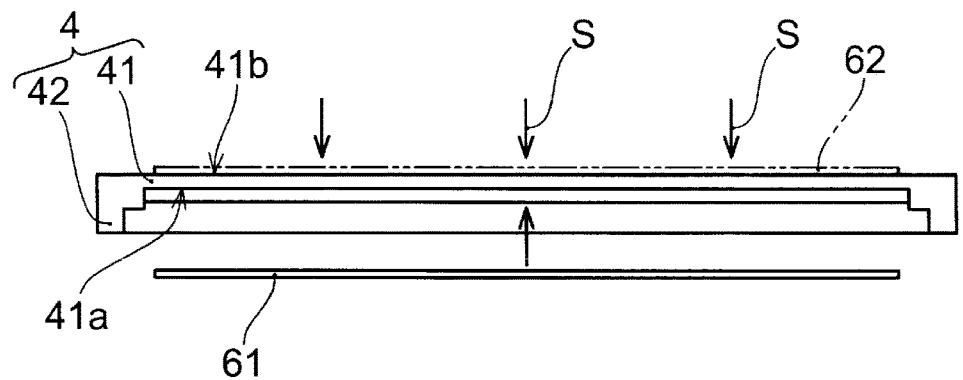
FIG. 11A shows an example of a method of forming first and second functional layers shown in FIG. 2B.
Figure 11B:
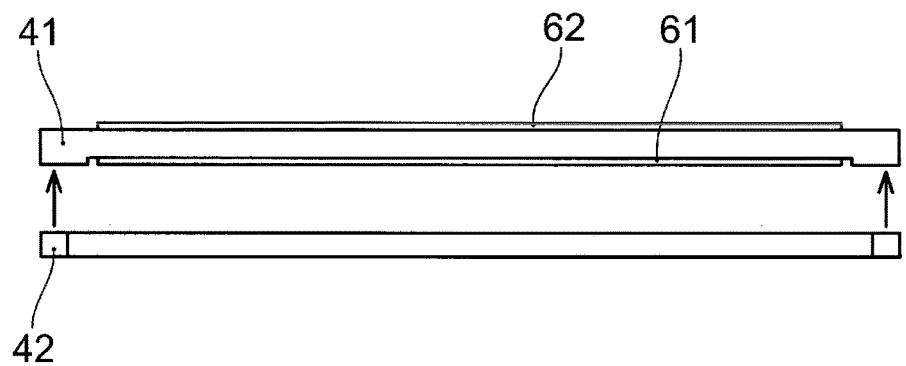
FIG. 11B shows an example of a method of forming the holding member shown in FIG. 2B.

With reference to FIGS. 11A and 11B, preparing of the holding member 4 is further explained. In the preparing of the holding member 4, the first functional layer 61 is provided as described previously. Moreover, in the preparing of the holding member 4, in addition to the first functional layer 61, the second functional layer 62 having a given function related to propagation of light can be provided at the front surface portion 41. The given function of the second functional layer 62 is different from a function that the first functional layer 61 has. The given function that the first functional layer 61 and the second functional layer 62 includes a function as a polarizing plate, a selective reflection function, or a selective absorption function, or the like. The second functional layer 62 is provided on a surface opposite a surface of the front surface portion 41 on which the first functional layer 61 is provided. In other words, as show in FIG. 11A, when the first functional layer 61 is provided on the first surface 41a, the second functional layer 62 is formed on the second surface 41b.

When the first functional layer 61 having a function as a polarizing plate or the second functional layer 62 having a function as a polarizing plate is provided, a commercially-available polarizing plate can be adhered to the front surface portion 41 of the holding member 4, for example, as with the first functional layer 61 shown in FIG. 11A. Such a polarizing plate is adhered to the holding member 4 using an optically transparent adhesive such as the previously-described OCA or OCR, for example.

Also when the first functional layer 61 or the second functional layer 62 having the previously-described antireflective function, or each function of selective reflection, selective absorption, or selective transmission, an optical functional film having such functions is prepared to be adhered to the holding member 4. However, the optical functional film that has been formed separately from the holding member 4 normally includes the base material, causing the transmittance of light to decrease and the interface of materials each having a different refractive index from each other to increase. Moreover, when a gap is produced between a film formed separately and the holding member 4, the interface further increases. Therefore, the first functional layer 61 or the second functional layer 62 having the antireflective function is preferably formed directly at the front surface portion 41 of the holding member 4. For example, as with the second functional layer 62 shown in FIG. 11A, sputtering, which causes sputtered particles S to be adhered to the front surface portion 41 of the holding member 4, or vacuum deposition or CVD (chemical vapor deposition) is used. Preferably, a multilayered layer including the previously-described magnesium fluoride or the like is formed using any of these methods, so that the first functional layer 61 or the second functional layer 62 that has an optical function is formed. Moreover, the first functional layer 61 or the second functional layer 62 that has the optical function can be formed by coating, drying, and heating a solution containing material particles using Sol-Gel process.

Moreover, the first functional layer 61 or the second functional layer 62 that has an antistatic function can be formed by sputtering a transparent conductive material such as indium tin oxide (ITO) or indium oxide-zinc oxide (IZO), or coating and heat curing of a solution thereof. Moreover, the first functional layer 61 or the second functional layer 62 that has an antifouling function can be formed by coating a fluorine resin, for example. Moreover, the first functional layer 61 or the second functional layer 62 that has a surface protecting function against flaw can be formed with a film containing $SiO_2$, for example. The film containing $SiO_2$ is formed with a thickness of approximately 10 μm to 30 μm, for example, by CVD or coating. The film containing $SiO_2$ can have a pencil hardness of approximately 5H by being formed in such a manner and can have at a pencil hardness of approximately 6H to 8H by being baked further. Moreover, a film containing $SiO_2$ and having a pencil hardness of over 8H with a thickness of 5 μm can be formed as the first functional layer 61 or the second functional layer 62 by sputtering or vacuum deposition.

As shown in FIG. 11B, the front surface portion 41 and the frame portion 42 of the holding member 4 can be formed separately by, for example, die molding and then can be adhered to each other. In this case, the front surface portion 41 and the frame portion 42 can be formed using different materials. A glass plate can be used, for example, for the front surface portion 41 that is formed using a light-transmitting material. In the example in FIG. 11B, the first functional layer 61 and the second functional layer 62 have already been provided at the front surface portion 41 before being adhered to the frame portion 42. Since forming step of the previously-described optical functional film and/or adhering step of the polarizing plate can be performed for the front surface portion 41 which is yet a single object, it is possible to easily form the first functional layer 61 or the like. Adhering of the front surface portion 41 and the frame portion 42 can be performed before or after placing the display panel 3 (see FIG. 10) on the surface 5a of the support 5 after making only the frame portion 42 adhere to the support 5. In this way, the display panel 3 can be placed easily.

Explanations of the method for manufacturing the display apparatus according to the present embodiment follows with reference to FIG. 10 again. The support 5 comprising the surface 5a on which the display panel 3 is to be placed is prepared. Arbitrary materials such as glass, a metal, and a synthetic resin can be used for the support 5. The support 5 can be prepared by processing these materials with an arbitrary method, or an existing article can be prepared as the support 5. As described previously, for example, a glass plate used for a casing of various devices, a window pane of a residence, or a display case, or a windshield of an automobile can be prepared as the support 5.

Although not shown in FIG. 10, a polarizing plate 51 (see FIG. 4) can be provided on the surface 5a of the support 5. Moreover, a functional layer (not shown) having an infrared-ray reflective function or an ultraviolet-ray absorbing function can be provided in addition to the polarizing plate 51, or instead of the polarizing plate 51. These optical functional films or polarizing plates that can be provided on the surface 5a of the support 5 can be provided with a method similar to a method previously described as the method of forming the first functional layer 61 and the second functional layer 62.

The holding member 4 is adhered onto the surface 5a of the prepared support 5 using the adhesive 8. The holding member 4 is adhered to the support 5 at a position such that the frame portion 42 surrounds an appropriate placement position for the display panel 3. As needed, a heat treatment process is performed for hardening the adhesive 8. Moreover, the wiring 9 formed with an FPC or the like is prepared. For example, the wiring 9 and the display panel 3 are connected by pressurizing and heating an anisotropic conductive film which is sandwiched between the wiring 9 and the display panel 3. The adhesive 8 can be coated on either or both of a bonding surface of the holding member 4 and the surface 5a, or can be placed between the holding member 4 and the support 5 after being molded in a frame-shaped sheet form. For the adhesive 8, an arbitrary adhesive such as an acrylic adhesive, a silicone adhesive, or a urethane adhesive is used.

After the holding member 4 is adhered to the support 5, the inner wall of the frame portion 42 of the holding member 4 engages with the edge of the display panel 3. As shown in FIG. 10, the display 3 is moved from the outside of the frame portion 42 to a given placement position inside the frame portion 42 through the notch 42a formed at the holding member 4. The inner wall of the frame portion 42 engages with the edge of the display panel 3 inside the frame portion 42 and the display surface 3a of the display panel 3 is covered by the front surface portion 41. The display panel 3 is moved to the inner portion of the frame portion 42 while directing the opposite surface 3b of the display surface 3a to the support 5. Then, the display panel 3 is placed at a proper placement position at which a tip portion of the display panel 3 in an orientation of movement thereof abuts the inner wall, which faces the notch 42a, of the frame portion 42. Adhering the holding member 4 to a proper position of the support 5 makes it possible to position the display panel 3 at the proper placement position by only moving the display panel 3, from the notch 42a to the inside of the frame portion 42, until the tip of the display panel 3 abuts the inner wall of the frame portion 42. The holding member 4 that can have a structure simpler than that of the display panel 3 is considered to be easy to be removed from the support 5 to be adhered to again without being subjected to breakage even when the holding member 4 is not adhered to a proper position on the surface 5a of the support 5. Moreover, even in the event the holding member 4 is subjected to breakage, since the holding member 4 can be prepared more cheaply compared to the display panel 3, it is possible to reduce loss cost.

The edge of the display panel 3 can be engaged with the inner wall of the holding member 4 by having the display panel 3 and the holding member 4 combined before the holding member 4 is adhered to the support 5. Then, thereafter, the display panel 3 can be placed onto the surface 5a, together with the holding member 4 being adhered to the support 5. In this case as well, the fact that the possibility of repositioning of the holding member 4 is relatively high and that it is easy to suppress the loss cost in the worst-case scenario is the same as in the previous-described explanations.

While FIG. 10 shows an overview of the method for manufacturing according to the present embodiment with the display apparatus 1 shown in FIG. 1 as an example, the display apparatus 1a exemplified in FIG. 7 previously referred to can be manufactured as well with a method similar to that shown in FIG. 10. When the display apparatus 1a exemplified in FIG. 7 is manufactured, the holding member 40 that is shown in FIGS. 8A and 8B previously referred to is prepared. The holding member 40 further comprises a plate-shaped back surface portion 43 that is connected to the front surface portion 41 via the frame portion 42 so as to be spaced from and to face the first surface 41a of the front surface portion 41. The holding member 40 can be manufactured with a method similar to the method of forming the holding member 4 as previously described such that holding member 40 can comprise such a back surface portion 43. The holding member 40 is adhered onto the surface 5a of the support 5 using the adhesive 8, preferably onto the whole surface of the back surface portion 43, while the back surface portion 43 being directed to the support 5. Moreover, a discontinuous portion is provided at the frame portion 42 by appropriately manufacturing a die used in forming the holding member 40, for example, and, as a result, an aperture 42b is provided on a side surface of the holding member 40. In placing the display panel 3 onto the surface 5a of the support 5 as described above, the display panel 3 is moved from the outside of the frame portion 42 to a given placement position inside the frame portion 42 via the aperture 42b.

When the holding member 40 is prepared, the method for manufacturing the display apparatus according to the present embodiment can further comprise providing the third functional layer 63 having a given function related to propagation of light on a third surface 43c of the back surface portion 43 of the holding member 40 or on a surface (the fourth surface 43d) opposite the third surface 43c. The third surface faces the first surface 41a of the front surface portion 41. As the third functional layer 63, in the same manner as the first functional layer 61 or the second functional layer 62, a polarizing plate can be provided and an optical functional film having an arbitrary function such as a selective reflection function or a selective absorption function can be provided. The third functional layer 63 can be formed with a method which is the same as the method of providing the first functional layer 61 or the second functional layer 62 as described above.

Figure 11C:
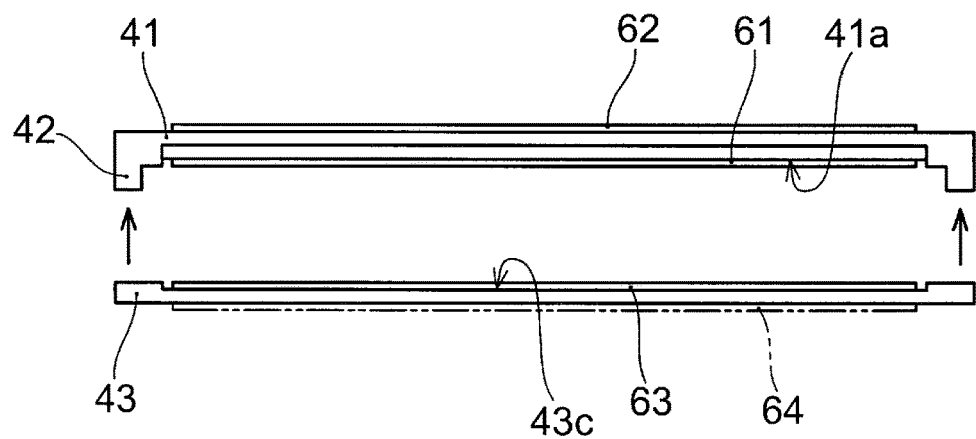
FIG. 11C shows an example of the method of forming the holding member shown in FIG. 8B.

In preparing the holding member 40, the front surface portion 41 and the back surface portion 43 can be connected after being formed separately as shown in FIG. 11C. In that case, preferably, before the front surface portion 41 and the back surface portion 43 are connected, as needed, the first functional layer 61 is provided on the first surface 41a of the front surface portion 41 and the third functional layer 63 is provided on the third surface 43c of the back surface portion 43. In other words, after performing either or both of providing the first functional layer 61 on the first surface 41a of the front surface portion 41 and providing the third functional layer 63 on the third surface 43c of the back surface portion 43, the front surface portion 41 and the back surface portion 43 can be connected via the frame portion 42. By separately forming the front surface portion 41 and the back surface portion 43, either or both of the first functional layer 61 and the third functional layer 63 can be provided easily before connecting both of the front surface portion 41 and the back surface portion 43.

Figure 12A:
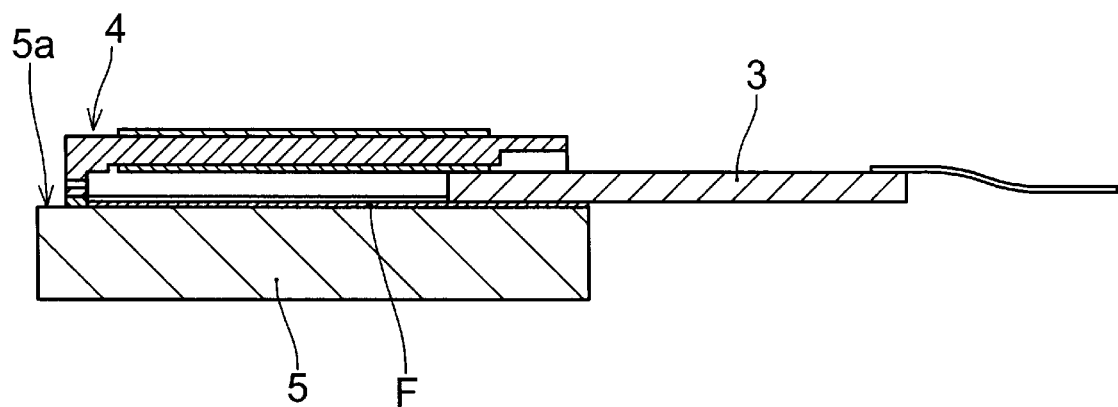
FIG. 12A shows an example of placement of the display panel in the method for manufacturing shown in FIG. 10.

When the display panel 3 is moved to a given placement position as shown in FIG. 10 referred to previously, a lubricant F can be used to improve the sliding property of the display panel 3 as shown in FIG. 12A. In the example in FIG. 12A, the surface 5a of the support 5 is covered with the lubricant F that is provided by coating, dropping, or spraying. The lubricant F can be used to smoothly move the display panel 3 toward the placement position. While a water-soluble solution such as ethanol, or silicone oil is exemplified as the lubricant F, the lubricant F is not construed to be limited thereto. If either or both of the first barrier layer 37 and the second barrier layer 38 that are described previously (see FIG. 9) is formed, penetration of the lubricant F into the display panel 3 can be prevented, making it possible to use a wide variety of lubricants F.

Figure 12B:
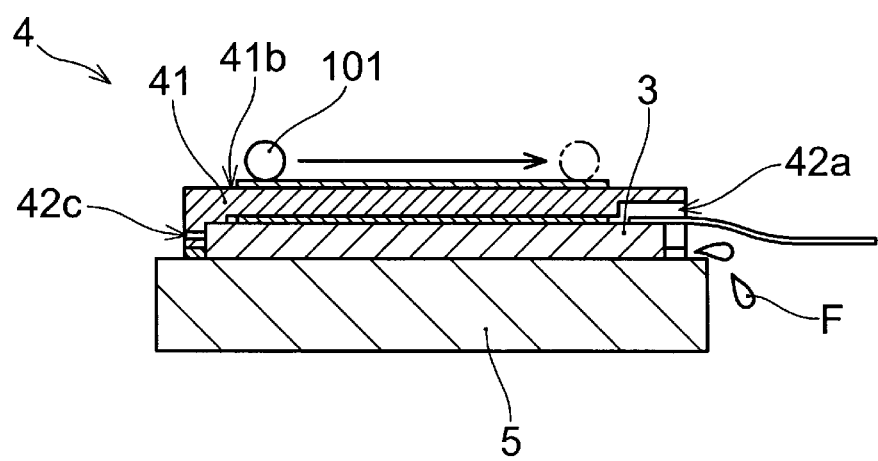
FIG. 12B shows an example of placement of the display panel in the method for manufacturing shown in FIG. 10.

When the lubricant F is used, the lubricant F can be extruded from a gap between the display panel 3 and the support 5 by pressing the display panel 3 toward the support 5 as shown in FIG. 12B after moving the display panel 3 to a given placement position. In the example in FIG. 12B, the display panel 3 is pressed toward the support 5 by a pressing member 101, together with the front surface portion 41, from the second surface 41b of the front surface portion 41 of the holding member 4. When the holding member 4 is formed using an elastic material such as a transparent silicone rubber as described above, a proper load can be applied to the display panel 3 without imparting excessive stress to the holding member 4 in such a pressing operation.

The pressing member 101 is moved from a distal end of the display panel 3 to a proximal end of the display panel 3 from the notch 42a or the aperture 42b (see FIG. 8B) of the holding member 4. In other words, the display panel 3 is pressed toward the support 5 while changing the pressing position from the distal end to the proximal end of the display panel 3 from the notch 42a or the aperture 42b (see FIG. 8B) of the holding member 4. The display panel 3 can be pressed in this way to efficiently extrude the lubricant F from the gap between the display panel 3 and the support 5. Moreover, the display panel 3 can be adhered to the support 5 without newly causing an entrapment of air bubble. The pressing member 101 is not construed to be particularly limited as long as it can apply load to the display panel 3. A rollable member such as a roller is preferable as the pressing member 101 from a point of view of reducing stress imparted to the holding member 4.

When the display panel 3 is removed from the support 5 as needed, a gas can be injected from the notch 42a of the holding member 4 or the aperture 42b (see FIG. 8B) of the holding member 40 to thereby easily separate the display panel 3 and the surface 5a of the support 5. Moreover, as shown in FIG. 12B, a ventilation hole 42c for injecting such a gas can be provided at the frame portion 42 of the holding member 4. Such a ventilation hole is also beneficial in that it can be a discharge hole for gas within the holding member 4 when the display panel 3 is moved to inside the frame portion 42.

Figure 13:
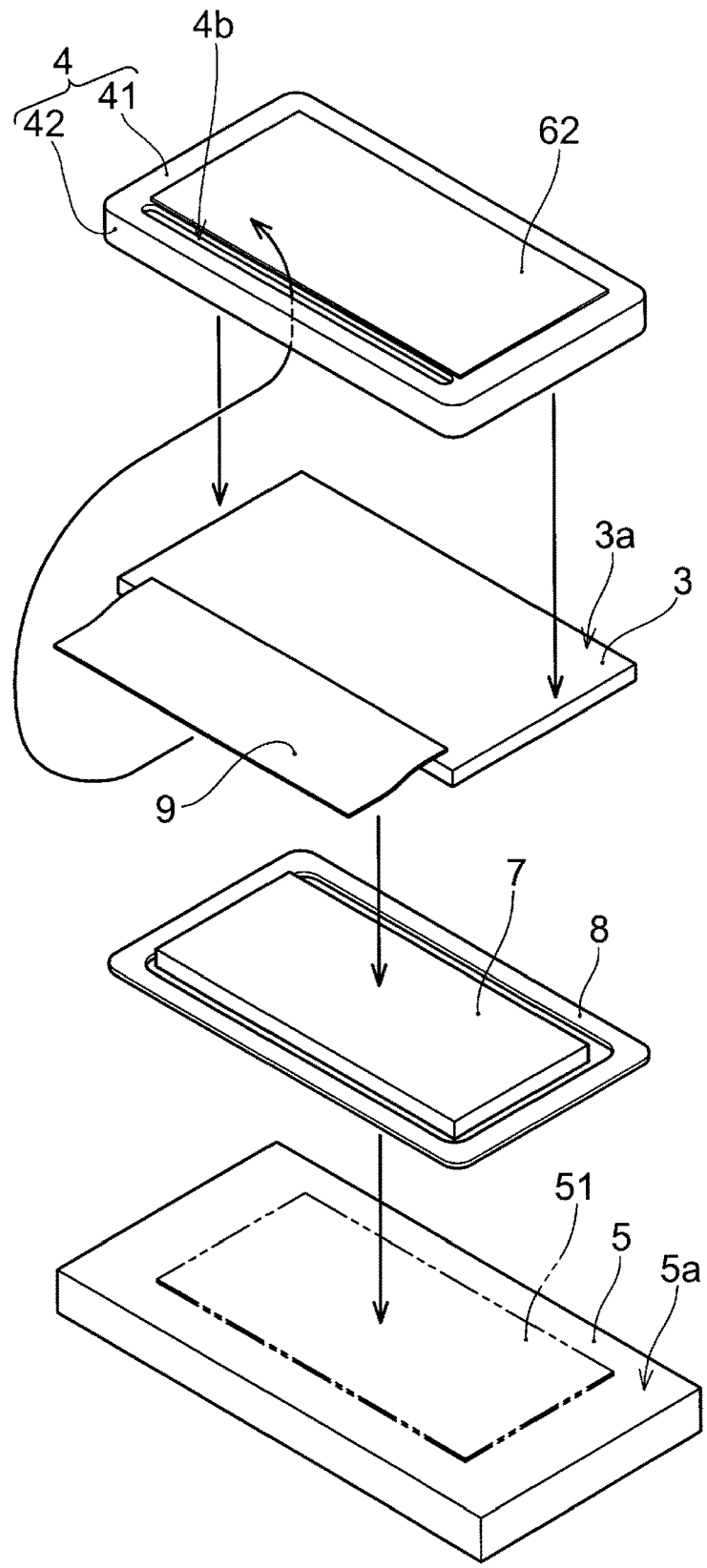
FIG. 13 shows another example of the method for manufacturing of the display apparatus according to Embodiment 3 of the present invention.

FIG. 13 shows another example of the method for manufacturing of the display apparatus according to the present embodiment with the display apparatus 1 as an example which is shown in FIGS. 5A and 5B previously referred to. The holding member 4 used for the display apparatus 1 shown in FIGS. 5A and 5B does not comprise a discontinuous portion at the frame portion 42, and, therefore, neither a notch nor an aperture is formed on the side surface of the holding member 4. Thus, in the method shown in FIG. 13, a manner of engaging of the display panel 3 with the holding member 4 and placing of display panel 3 onto the surface 5a of the support 5 differs from that in the example shown in FIG. 10.

Figure 14:
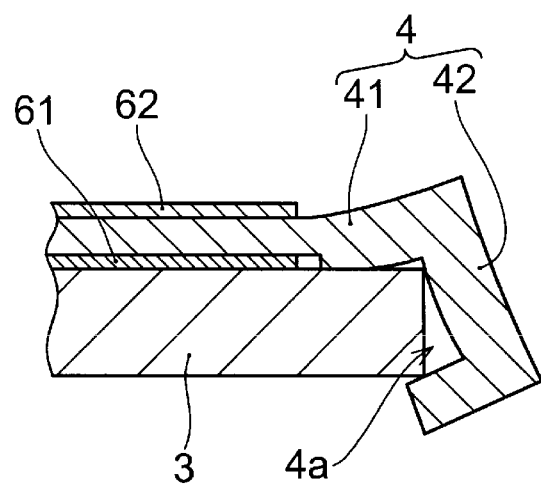
FIG. 14 shows an example of engagement of the holding member and the display panel in the method for manufacturing shown in FIG. 13.

In other words, the display panel 3, the holding member 4, and the support 5 are prepared with the same method as the method described with reference to FIG. 10, and, thereafter, the display panel 3 is combined with the holding member 4 from a state in which the display surface 3a faces the first surface 41a (see FIG. 5B) of the front surface portion 41 of holding member 4. The edge of the display panel 3 is inserted into the groove 4a (see FIG. 5B) at the inner wall of the frame portion 42, and the edge of the display panel 3 engages with the inner wall of the frame portion 42. Moreover, the display surface 3a of the display panel 3 is covered by the front surface portion 41 of the holding member 4. When the holding member 4 is formed with a material having elasticity or flexibility, such as a silicone rubber as described previously, the holding member 4, as shown in FIG. 14, can be deformed to easily insert the edge of the display panel 3 into the groove 4a. Moreover, as shown in FIG. 13, the wiring 9 is drawn to the outside of the holding member 4 via the aperture 4b of the front surface portion 41 of the holding member 4.

The holding member 4 is adhered onto the surface 5a of the support 5 with the adhesive 8 while directing the first surface 41a of the front surface portion 41 to the support 5 in a state such that the holding member 4 is combined with the display panel 3. Moreover, along with adhering thereof, the display panel 3 is placed on the surface 5a of the support 5 while directing an opposite surface of the display surface 3a to the support 5. In the example shown in FIG. 13, the display panel 3 is placed on the surface 5a of the support via the weak adhesive layer 7. The weak adhesive layer 7 is formed, for example, by positioning a weak adhesive sheet formed using an adhesive on the surface 5a of the support 5 or on a surface of the display panel 3 that is opposite the display surface 3a. In the example shown in FIG. 13 as well, an optical functional film comprising the polarizing plate 51 or a selective reflection function can be formed on the surface 5a of the support 5 with a previously-described method before the display panel 3 is placed on the surface 5a of the support 5.

SUMMARY (1) A display apparatus according to one embodiment of the present invention comprises: a display panel to control emission or transmission of light to display an image; a support comprising a surface on which the display panel is placed; and a holding member that is adhered onto the surface of the support and engages with an edge of the display panel to hold the display panel at a given position of the surface, wherein the display panel has an opposite surface of a display surface of the display panel, the opposite surface being directed to the support; the holding member comprises a front surface portion formed using a light-transmitting material to cover the display surface, the front surface portion being plate shaped, and a frame portion comprising a rod-shaped member provided in such a manner as to be protruded from a first surface of the front surface portion and to be along an edge of the front surface portion, the first surface being directed to the display surface; and the front surface portion comprises a first functional layer on the first surface or on a second surface opposite the first surface, the first functional layer having a given function related to propagation of light.

According to the configuration of (1), even when a defect occurs in some of constituting elements of one display apparatus, it is possible to easily reuse other constituting elements in the one display apparatus, or another display apparatus.

(2) In the display apparatus of (1), the first functional layer can comprise an antireflection layer configured to suppress reflection of light, or a polarizing plate. In this way, the antireflection layer or the polarizing plate can be reused even when a defect occurs in the display panel.

(3) In the display apparatus of (1) or (2), the holding member can comprise the first functional layer on the first surface of the front surface portion and a second functional layer on the second surface, the second functional layer having a given function related to propagation of light, wherein the given function of the second functional layer is different from a function that the first functional layer has. In this way, two functional layers having mutually different functions related to propagation of light can be reused even when a defect occurs in the display panel.

(4) In the display apparatus of (3), the first functional layer can comprise a polarizing plate and the second functional layer can comprise an antireflection layer configured to suppress reflection of light. This makes it possible to bring the polarizing plate in contact with the display panel and to obtain an appropriate polarizing effect and effectively prevent reflection of external light.

(5) In the display apparatus of any one of (1) to (4), the holding member further can comprise a back surface portion connected to the front surface portion via the frame portion so as to be spaced from and face the first surface of the front surface portion, the back surface portion being plate shaped and being adhered onto the surface, and the display panel can be positioned between the front surface portion and the back surface portion. This makes it easy to provide a specific functional layer between the display panel and the support.

(6) In the display apparatus of (5), the back surface portion can comprise a third functional layer having a given function related to propagation of light on a third surface facing the first surface of the front surface portion or on a surface opposite the third surface. In this way, an optical functional film which can be provided on a surface opposite the display surface of a conventional display panel can be reused when a defect occurs in the display panel.

(7) In the display apparatus of (6), the back surface portion can comprise a polarizing plate as the third functional layer on the third surface. In this way, the polarizing plate can be provided while the polarizing plate is in contact with the display panel and the polarizing plate can be reused when a defect occurs in the display panel.

(8) In the display apparatus of any one of (1) to (5), a polarizing plate can be provided on the surface of the support. In this way, a polarizing plate that can be provided on a surface opposite the display surface in a conventional display panel can be reused when a defect occurs in the display panel.

(9) In the display apparatus of any one of (1) to (8), the frame portion can comprise a discontinuous portion at a part of the edge of the front surface portion and a notch or an aperture through which the display panel can be inserted can be formed on a side surface of the holding member formed of the frame portion. In this way, the display panel can easily be removed from the support as needed.

(10) In the display apparatus of (1) to (9), the display panel can comprise a substrate and a plurality of display elements formed on the substrate, and the display panel further comprises a barrier layer formed using a moisture impermeable material at either one of or both of between the display elements and the substrate and on the display elements. In this way, the display panel can be protected from moisture. Moreover, lifting of the display panel from the support can be suppressed.

(11) In the display apparatus of (10), a water vapor transmission rate of the barrier layer can be $1 \times 10^{-4}$ g/m²/day or less. In this way, penetration of moisture into the display panel can be prevented more steadily.

(12) A method for manufacturing a display apparatus according to a further embodiment comprises: forming a display panel by forming a plurality of display elements on a substrate; preparing a support comprising a surface on which the display panel is to be placed; preparing a holding member comprising a front surface portion, the front surface portion being plate shaped, and a frame portion comprising a rod-shaped member provided in such a manner as to be protruded from a first surface of the front surface portion and to be along an edge of the front surface portion, the first surface being a surface other than a side surface of the front surface portion; adhering the holding member onto the surface of the support while directing the first surface to the support; engaging an inner wall of the frame portion with an edge of the display panel such that a display surface of the display panel is covered by the front surface portion; and placing the display panel on the surface of the support while directing an opposite surface of the display surface to the support, wherein in preparing the holding member, the front surface portion is formed using a light-transmitting material, and a first functional layer having a given function related to propagation of light is provided on the first surface or a second surface of the front surface portion, the second surface being opposite the first surface.

According to the configuration of (12), it is possible to easily manufacture a display apparatus in which reuse of constituting elements is easy and which comprises a display panel at a proper position.

(13) The method for manufacturing the display apparatus of (12) can further comprise: providing the first functional layer on the first surface of the front surface portion of the holding member; and providing a second functional layer on the second surface, the second functional layer having a given function related to propagation of light, wherein the given function of the second functional layer is different from a function that the first functional layer has. In this way, a display apparatus can be manufactured in which two functional layers having mutually different functions related to propagation of light can be reused even when a defect occurs in the display panel.

(14) In the method for manufacturing the display apparatus of (12) or (13), the holding member can further comprise a back surface portion connected to the front surface portion via the frame portion so as to be spaced from and to face the first surface of the front surface portion, the back surface portion being plate shaped; the method can further comprise, in preparing the holding member, providing a third functional layer having a given function related to propagation of light on a third surface of the back surface portion or on a surface opposite the third surface, the third surface facing the first surface of the front surface portion; and the holding member is adhered onto the surface of the support while directing the back surface portion to the support. In this way, a display apparatus can be manufactured in which an optical functional film that can be provided on an opposite surface of the display surface in a conventional display panel can be reused when a defect occurs in the display panel.

(15) The method for manufacturing the display apparatus of (14) can further comprise, in preparing the holding member: separately forming the front surface portion and the back surface portion; performing either or both of providing the first functional layer on the first surface of the front surface portion; and providing a third functional layer on the third surface of the back surface portion; and connecting the front surface portion and the back surface portion via the frame portion. In this way, the first functional layer and/or the third functional layer can be provided easily.

(16) The method for manufacturing the display apparatus of (12) or (13) can further comprise providing a polarizing plate on the surface of the support. In this way, a display apparatus can be manufactured in which the polarizing plate that can be provided on an opposite surface of the display surface in a conventional display panel can be reused when a defect occurs in the display panel.

(17) The method for manufacturing a display apparatus of any one of (12) to (16) can further comprise, in forming the display panel, forming a barrier layer using a moisture impermeable material at either one of or both of between the substrate and the display elements and on the display elements. In this way, a display apparatus can be manufactured in which the display panel is protected from moisture and lifting of the display panel from the support is reduced.

(18) The method for manufacturing a display apparatus of any one of (12) to (17) can further comprise: in preparing the holding member, providing a discontinuous portion to provide an aperture or a notch on a side surface of the holding member; and moving the display panel from outside the frame portion to a given placement position inside the frame portion via the aperture or the notch. In this way, the display panel can easily be placed at the given placement position.

(19) The method for manufacturing a display apparatus of (18) can further comprise: in forming the display panel, forming a barrier layer using a moisture impermeable material both between the substrate and the display elements and on the display elements; improving the sliding property of the display panel by using a lubricant when the display panel is moved to the given placement position; and extruding the lubricant from a gap between the display panel and the support by pressing the display panel toward the support while changing a pressing position from a distal end to a proximal end of the display panel from the aperture or the notch after the display panel is moved to the given placement position. In this way, the display panel can be moved smoothly toward the placement position and the display panel can be tightly adhered to the surface of the support.

DESCRIPTION OF REFERENCE NUMERAL 1, 1a display apparatus
3 display panel
3a display surface
3b opposite surface
3c substrate
30 display element
37 first barrier film
4, 40 holding member
41 front surface portion
41a first surface
41b second surface
42 frame portion
42a notch
42b aperture
43 back surface portion
43c third surface
43d opposite surface (fourth surface)
5 support
5a surface
51 polarizing plate
61 first functional layer
62 second functional layer
63 third functional layer
64 fourth functional layer
101 pressing member
F lubricant

The invention claimed is:
1. A display apparatus comprising:
  a display panel to control emission or transmission of light to display an image;
  a support comprising a surface on which the display panel is placed; and
  a holding member that is adhered onto the surface of the support and engages with an edge of the display panel to hold the display panel at a given position of the surface, wherein
  the display panel has an opposite surface of a display surface of the display panel, the opposite surface being directed to the support;
  the holding member comprises
    a front surface portion formed using a light-transmitting material and comprising a part to cover an image displayed on the display panel, the front surface portion being plate shaped,
    a frame portion comprising a rod-shaped member provided in such a manner as to be protruded from a first surface of the front surface portion and to be along an edge of the front surface portion, the first surface being directed to the display surface, and
    a back surface portion being plate shaped and being connected to the front surface portion via the frame portion so as to be spaced from and face the first surface of the front surface portion;
  the front surface portion and the frame portion are integrally formed;

the back surface portion is adhered onto the surface of the support;

the display panel is positioned between the front surface portion and the back surface portion; and the front surface portion comprises a first functional layer on the first surface or on a second surface opposite the first surface, wherein the first functional layer has a given function related to propagation of light, and is formed on the first surface or the second surface.

2. The display apparatus according to claim 1, wherein the first functional layer has an infrared-ray reflective function or an ultraviolet-ray absorbing function.

3. The display apparatus according to claim 1, wherein the front surface portion comprises the first functional layer on the first surface and a second functional layer on the second surface, the second functional layer having a given function related to propagation of light, wherein the given function of the second functional layer is different from a function that the first functional layer has.

4. The display apparatus according to claim 3, wherein the second functional layer has an infrared-ray reflective function or an ultraviolet-ray absorbing function.

5. The display apparatus according to claim 1, wherein the back surface portion comprises a third functional layer having a given function related to propagation of light on a third surface facing the first surface of the front surface portion or on a surface opposite the third surface.

6. The display apparatus according to claim 5, wherein the third functional layer has an antireflective function, an infrared-ray reflective function, or an ultraviolet-ray absorbing function.

7. The display apparatus according to claim 1, wherein a functional layer having an infrared-ray reflective function or an ultraviolet-ray absorbing function is provided on the surface of the support.

8. The display apparatus according to claim 1, wherein the frame portion comprises a discontinuous portion at a part of the edge of the front surface portion and a notch or an aperture through which the display panel can be inserted is formed on a side surface of the holding member formed of the frame portion.

9. The display apparatus according to claim 1, wherein at the edge of the display panel, the display panel abuts the holding member with a side surface, with the display surface, and with the opposite surface of the display surface.

10. The display apparatus according to claim 1, further comprising a wiring being connected to the display panel, wherein the holding member comprises an aperture through which the wiring is passed at the front surface portion.

11. The display apparatus according to claim 1, wherein the front surface portion of the holding member is formed using a transparent silicone rubber.

12. A method for manufacturing a display apparatus, the method comprising:

forming a display panel by forming a plurality of display elements on a substrate;

preparing a support comprising a surface on which the display panel is to be placed;

preparing a holding member comprising a front surface portion being plate shaped, a frame portion, and a back surface portion being plate shaped and being connected to the front surface portion via the frame portion so as to be spaced from and face a first surface of the front surface portion, wherein the frame portion comprises a rod-shaped member provided in such a manner as to be protruded from the first surface of the front surface portion and to be along an edge of the front surface portion, the first surface being a surface other than a side surface of the front surface portion;

adhering the holding member onto the surface of the support;

engaging an inner wall of the frame portion with an edge of the display panel such that a display surface of the display panel is covered by the front surface portion; and placing the display panel on the surface of the support while directing an opposite surface of the display surface to the support, wherein in preparing the holding member, the front surface portion is integrally formed with the frame portion using a light-transmitting material, the front surface portion comprising a part to cover an image displayed on the display panel, a first functional layer having a given function related to propagation of light is formed directly on the first surface or a second surface of the front surface portion, the second surface being opposite the first surface, and a third functional layer having a given function related to propagation of light is provided on a third surface of the back surface portion facing the first surface of the front surface portion or on a surface of the back surface portion opposite the third surface;

in adhering the holding member onto the surface of the support, the holding member is adhered while directing the back surface portion to the support.

13. The method for manufacturing the display apparatus according to claim 12, wherein in preparing the holding member, the first functional layer is formed directly on the first surface of the front surface portion; and preparing the holding member further comprises providing a second functional layer on the second surface, the second functional layer having a given function related to propagation of light, wherein the given function of the second functional layer is different from a function that the first functional layer has.

14. The method for manufacturing the display apparatus according to claim 12, further comprising providing a function layer having an infrared-ray reflective function or an ultraviolet-ray absorbing function on the surface of the support.

15. The method for manufacturing the display apparatus according to claim 12, further comprising:

in preparing the holding member, providing a discontinuous portion to provide an aperture or a notch on a side surface of the holding member; and moving the display panel from outside the frame portion to a given placement position inside the frame portion via the aperture or the notch.

16. The method for manufacturing the display apparatus according to claim 15, further comprising:

connecting a wiring to the display panel; and drawing the wiring to an outside of the holding member via an aperture of the front surface portion.

* * * * *